(12) United States Patent
Tuominen et al.

(10) Patent No.: US 8,704,359 B2
(45) Date of Patent: Apr. 22, 2014

(54) METHOD FOR MANUFACTURING AN ELECTRONIC MODULE AND AN ELECTRONIC MODULE

(75) Inventors: Risto Tuominen, Espoo (FI); Petteri Palm, Espoo (FI); Antti Iihola, Espoo (FI)

(73) Assignee: GE Embedded Electronics Oy, Helsinki (FI)

( * ) Notice: Subject to any disclaimer, the term of this patent is extended or adjusted under 35 U.S.C. 154(b) by 378 days.

(21) Appl. No.: 13/118,650

(22) Filed: May 31, 2011

(65) Prior Publication Data

US 2011/0291293 A1 Dec. 1, 2011

Related U.S. Application Data

(63) Continuation-in-part of application No. 12/619,350, filed on Nov. 16, 2009, now Pat. No. 8,034,658, which is a continuation of application No. 10/550,023, filed as application No. PCT/FI2004/000195 on Mar. 31, 2004, now Pat. No. 7,663,215.

(30) Foreign Application Priority Data

Apr. 1, 2003 (FI) ..................................... 20030493

(51) Int. Cl.
*H01L 23/12* (2006.01)
*H01L 23/053* (2006.01)

(52) U.S. Cl.
USPC ........... 257/700; 257/701; 257/702; 257/774; 438/107

(58) Field of Classification Search
USPC ................... 438/107; 257/700, 701, 702, 774
See application file for complete search history.

(56) References Cited

U.S. PATENT DOCUMENTS

| | | | |
|---|---|---|---|
| 4,246,595 A | 1/1981 | Noyori et al. |
| 4,746,392 A | 5/1988 | Hoppe |
| 5,048,179 A | 9/1991 | Shindo et al. |
| 5,248,852 A | 9/1993 | Kumagai |
| 5,306,370 A | 4/1994 | Herko et al. |
| 5,306,670 A | 4/1994 | Mowatt et al. |
| 5,353,195 A | 10/1994 | Fillion et al. |
| 5,355,102 A | 10/1994 | Kornrumpf et al. |
| 5,497,033 A | 3/1996 | Fillion et al. |

(Continued)

FOREIGN PATENT DOCUMENTS

| | | |
|---|---|---|
| JP | 172501/1983 | 6/1985 |
| JP | 4283987/1992 | 10/1992 |

(Continued)

*Primary Examiner* — Jarrett Stark
*Assistant Examiner* — Nicholas Tobergte
(74) *Attorney, Agent, or Firm* — Seppo Laine Oy; Joshua P. Wert

(57) ABSTRACT

This publication discloses an electronic module and a method for manufacturing an electronic module, in which a component (6) is glued (5) to the surface of a conductive layer, from which conductive layer conductive patterns (14) are later formed. After gluing the component (6), an insulating-material layer (1), which surrounds the component (6) attached to the conductive layer, is formed on, or attached to the surface of the conductive layer. After the gluing of the component (6), feed-throughs are also made, through which electrical contacts can be made between the conductive layer and the contact zones (7) of the component. After this, conductive patterns (14) are made from the conductive layer, to the surface of which the component (6) is glued.

22 Claims, 21 Drawing Sheets

(56) References Cited

U.S. PATENT DOCUMENTS

| | | |
|---|---|---|
| 5,552,633 A | 9/1996 | Sharma |
| 5,698,470 A | 12/1997 | Yamaguchi |
| 6,038,133 A | 3/2000 | Nakatani et al. |
| 6,074,567 A | 6/2000 | Kuraishi et al. |
| 6,154,366 A | 11/2000 | Ma et al. |
| 6,271,469 B1 | 8/2001 | Ma et al. |
| 6,284,564 B1 | 9/2001 | Balch et al. |
| 6,396,148 B1 | 5/2002 | Eichelberger et al. |
| 6,406,990 B1 | 6/2002 | Kawai |
| 6,475,877 B1 | 11/2002 | Saia et al. |
| 6,701,614 B2 | 3/2004 | Ding et al. |
| 6,713,859 B1 | 3/2004 | Ma |
| 6,783,077 B1 | 8/2004 | Fannasch |
| 6,876,072 B1 | 4/2005 | Wang et al. |
| 6,991,966 B2 | 1/2006 | Tuominen |
| 7,299,546 B2 * | 11/2007 | Tuominen et al. ............... 29/840 |
| 7,361,849 B2 | 4/2008 | Asai et al. |
| 7,402,760 B2 | 7/2008 | Wu |
| 7,609,527 B2 * | 10/2009 | Tuominen et al. ............ 361/761 |
| 7,663,215 B2 * | 2/2010 | Tuominen et al. ............ 257/686 |
| 7,696,005 B2 | 4/2010 | Iihola et al. |
| 2002/0117743 A1 | 8/2002 | Nakatani et al. |
| 2003/0068852 A1 | 4/2003 | Towle et al. |
| 2003/0159852 A1 | 8/2003 | Nakamura |
| 2006/0012967 A1 | 1/2006 | Asai et al. |

FOREIGN PATENT DOCUMENTS

| | | |
|---|---|---|
| JP | 311229/2000 | 11/2000 |
| JP | 2001-053447 | 2/2001 |
| JP | 37205/2003 | 2/2003 |
| WO | WO 03065778 | 8/2003 |

* cited by examiner

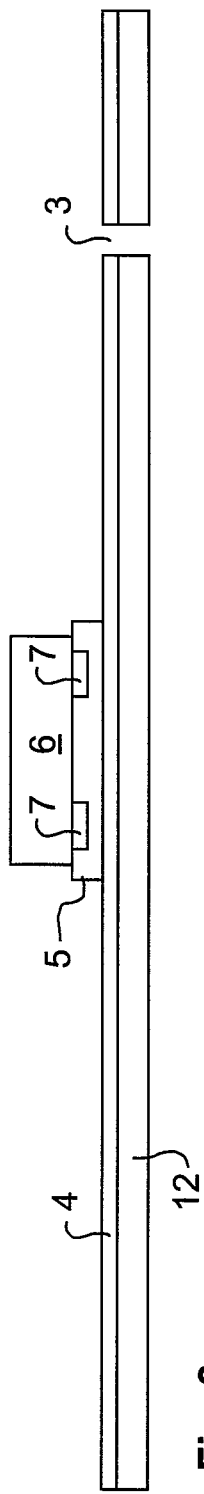
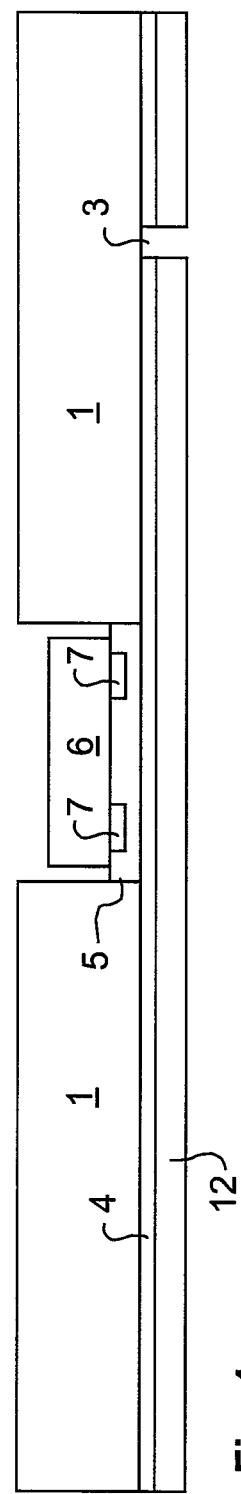
Fig. 3
Fig. 4

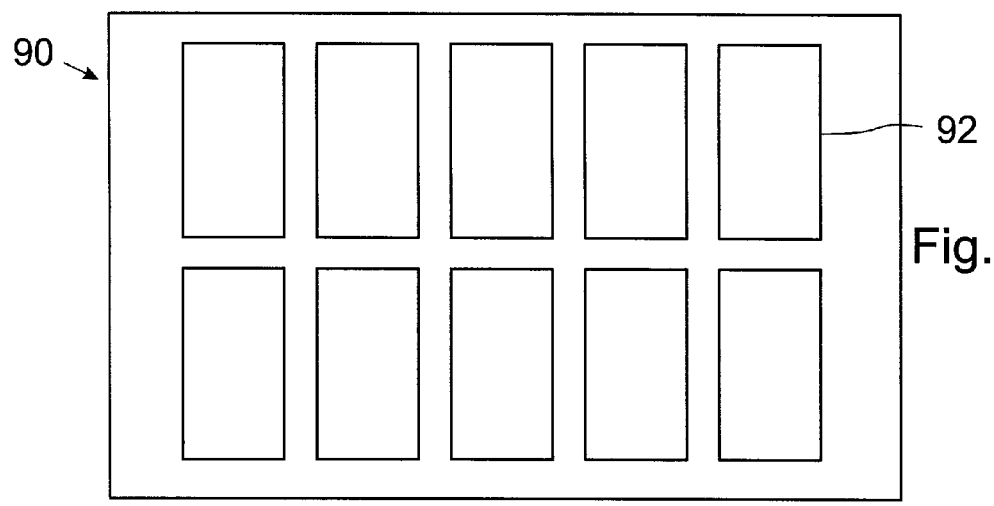
Fig. 12A
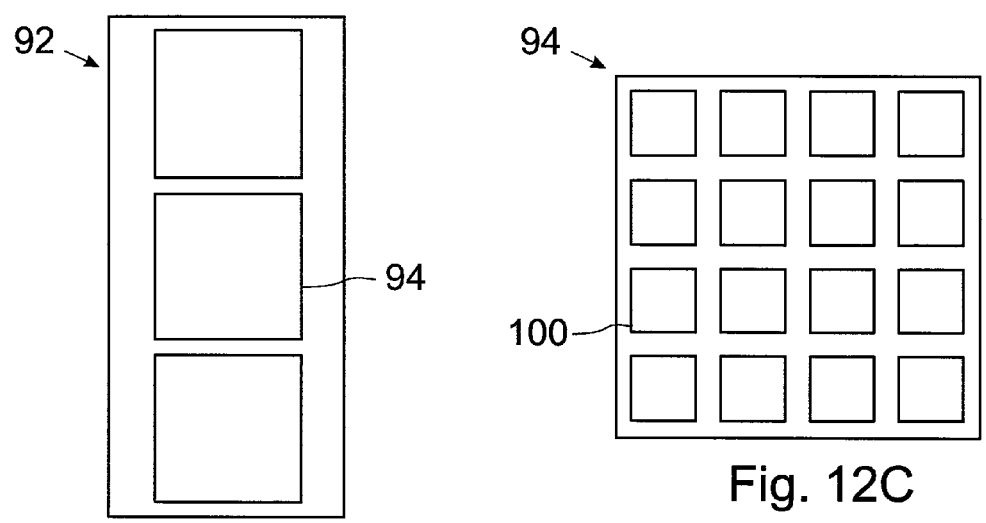
Fig. 12B
Fig. 12C
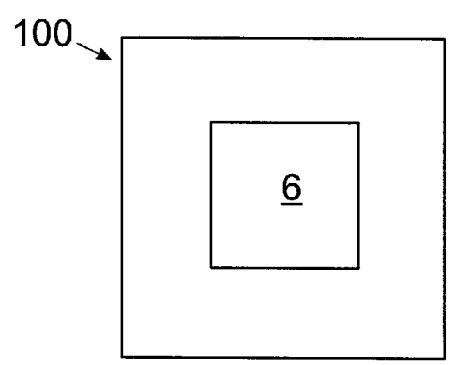
Fig. 12D

METHOD FOR MANUFACTURING AN ELECTRONIC MODULE AND AN ELECTRONIC MODULE

The present invention relates to an electronic module and a method for manufacturing an electronic module.

In particular, the invention relates to an electronic module, which includes one or more components embedded in an installation base. The electronic module can be a module like a circuit board, which includes several components, which are connected to each other electrically, through conducting structures manufactured in the module. The components can be passive components, microcircuits, semiconductor components, or other similar components. Components that are typically connected to a circuit board form one group of components. Another important group of components are components that are typically packaged for connection to a circuit board. The electronic modules to which the invention relates can, of course, also include other types of components.

The installation base can be of a type similar to the bases that are generally used in the electronics industry as installation bases for electrical components. The task of the base is to provide components with a mechanical attachment base and the necessary electrical connections to both components that are on the base and those that are outside the base. The installation base can be a circuit board, in which case the construction and method to which the invention relates are closely related to the manufacturing technology of circuit boards. The installation base may also be some other base, for example, a base used in the packaging of a component or components, or a base for an entire functional module.

The manufacturing techniques used for circuit boards differ from those used for microcircuits in, among other things, the fact that the installation base in microcircuit manufacturing techniques, i.e. the substrate, is of a semiconductor material, whereas the base material of an installation base for circuit boards is some form of insulating material. The manufacturing techniques for microcircuits are also typically considerably more expensive that the manufacturing techniques for circuit boards.

The constructions and manufacturing techniques for the cases and packages of components, and particularly semiconductor components differ from the construction and manufacture of circuit boards, in that component packaging is primarily intended to form a casing around the component, which will protect the component mechanically and facilitate the handling of the component. On the surface of the component, there are connector parts, typically protrusions, which allow the packaged component to be easily set in the correct position on the circuit board and the desired connections to be made to it. In addition, inside the component case, there are conductors, which connect the connector parts outside the case to connection zones on the surface of the actual component, and through which the component can be connected as desired to its surroundings.

However, component cases manufactured using conventional technology demand a considerable amount of space. As electronic devices have grown smaller, there has been a trend to eliminate component cases, which take up space, are not essential, and create unnecessary costs. Various constructions and methods have been developed to solve this problem.

One known solution is flip-chip (FC) technology, in which non-packaged semiconductor components are installed and connected directly to the surface of the circuit board. However, flip-chip technology has many weaknesses and difficulties. For example, the reliability of the connections can be a problem, especially in applications, in which mechanical stresses arise between the circuit board and the semiconductor component. In an attempt to avoid mechanical stresses, a suitable elastic underfill, which equalizes mechanical stresses, is added between the semiconductor component and the circuit board. This procedural stage slows down the manufacturing process and increases costs. Even the thermal expansion caused by the normal operation of a device may cause mechanical stresses large enough to compromise the long-term reliability of an FC structure.

U.S. Pat. No. 4,246,595 discloses one solution, in which recesses are formed in the installation base for the components. The bottoms of the recesses are bordered by a two-layered insulation layer, in which holes are made for the connections of the component. The layer of the insulation layer that lies against the components is made of an adhesive. After this, the components are embedded in the recesses with their connection zones facing the bottom of the recess, electrical contacts being formed to the components through the holes in the insulation layer. If it is wished to make the structure mechanically durable, the component must also be attached to an installation base, so that the method is quite complicated. It is extremely difficult to use a complicated method, which demands several different materials and process stages, to profitably manufacture cheap products. In other ways too, the method does not correspond to the technology used nowadays (the patent dates from 1981).

JP application publication 2001-53 447 discloses a second solution, in which a recess is made for the component in an installation base. The component is placed in the recess, with the component's contact zones facing towards the surface of the installation base. Next, an insulation layer is made on the surface of the installation base and over the component. Contact openings for the component are made in the insulation layer and electrical contacts are made to the component, through the contact openings. In this method, considerable accuracy is demanded in manufacturing the recess and setting the component in the recess, so that the component will be correctly positioned, to ensure the success of the feedthroughs, relative to the width and thickness of the installation board.

The invention is intended to create a relatively simple and economical method for manufacturing electronic modules, with the aid of which a mechanically durable construction can be achieved.

The invention is based on the component being glued to the conductive layer, from which conductive layer conductive patterns are later formed. After the gluing of the component, an insulating-material layer, which surrounds the component attached to the conductive layer, is formed on, or attached to the conductive layer. After the gluing of the component, feedthroughs are also made, through which electrical contacts can be formed between the conductive layer and the conductive zones of the component. After this, conductive patterns are formed from the conductive layer, to which the component is glued.

Considerable advantages are gained with the aid of the invention. This because it is possible, with the aid of the invention, to manufacture mechanically durable electronic modules, which include unpackaged components embedded in an installation base.

The invention permits a quite simple manufacturing method, in which relatively few different materials are required. For this reason, the invention has embodiments, with the aid of which electronic modules can be manufactured at low cost. For example, in the technique disclosed in U.S. Pat. No. 4,246,595, (the references are to FIG. 8 of the patent) a support layer 24, an insulating layer 16, and an adhesion layer 17 are required. In addition, a fourth insulating material (not shown in the embodiment of FIG. 8), i.e. filler with the aid of which the component is attached to the support layer 24, is also required, in order to create a mechanically sturdy attachment. In the solution of the JP application publication 2001-53 447 too, a corresponding attachment that entirely surrounds the component requires about 3-4 separate insulating materials, or insulating layers (publication FIGS. 2 and 4).

Unlike the reference publications, our invention has embodiments, in which the component can be entirely surrounded using 2-3 insulating materials, or insulating layers. This because the contact surface of the component is glued to a conductive layer, so that, in preferred embodiments, the adhesive attaches the component essentially over the entire area of its contact surface. Elsewhere, in such an embodiment, the component is attached with the aid of an insulating-material layer, which acts as the base material for the electronic module being formed. The insulating-material layer is formed after the gluing of the component, so that in preferred embodiments it can be made around the component to conform to the shape of the component. In such embodiments, it is possible to achieve a comprehensive attachment of the component with the aid of an adhesive layer and a base-material layer formed from 1-2 insulating-material sheets.

In the embodiments of the invention, it is thus possible to manufacture a circuit board, inside which components are embedded. The invention also has embodiments, with the aid of which a small and reliable component package can be manufactured around a component, as part of the circuit board. In such an embodiment, the manufacturing process is simpler and cheaper than manufacturing methods in which separate packaged components are installed and connected to the surface of the circuit board. The manufacturing method can also be applied to use the method to manufacture Reel-to-Reel products. Thin and cheap circuit-board products containing components can be made by using the methods according to the preferred embodiments.

The invention also permits many other preferred embodiments, which can be used to obtain significant additional advantages. With the aid of such embodiments, a component's packaging stage, the circuit board's manufacturing stage, and the assembly and connecting stage of the components, for example, can be combined to form a single totality. The combination of the separate process stages brings significant logistical advantages and permits the manufacture of small and reliable electronic modules. A further additional advantage is that such an electronic-module manufacturing method can mostly utilize known circuit-board manufacturing and assembly techniques.

The present invention discloses also several novel electronic module structures that prevent efficiently warpage within the electronic modules containing at least one embedded component inside an installation base. Warpage may occur after manufacturing of electronic modules containing embedded components normally before dicing phase when the electronic modules are in panel or strip level. Warpage may affect huge losses in yields of manufacturing electronic modules. Warpage occurs especially in panel level when huge semiconductor components, high amount of silicon components, microcircuit chips or other silicon based chips; in other words: the silicon area density is on high level; are embedded in an electronic module. Warpage of electronic modules, strips and panels containing embedded components is a result of different coefficients of thermal expansion (CTE) of different materials used within the electronic modules. Namely, the silicon based components have usually lower CTE than any other materials typically used in PCB and packaging industry, and especially different insulation materials, used within electronic modules containing embedded components. Furthermore, the totally cured (c-stage) resin, i.e. laminate layer hardly shrinks when heat and pressure is conducted to it.

According to the embodiments of the invention presented below, warpage can be prevented within the electronic modules, strips and panels when there are high silicon area density, i.e. huge embedded electronic components or high amount of silicon components.

In a preferred embodiment of the invention the comprises one relatively thick lamination layer (c-stage). The lamination layer has a prefabricated hole for a component to be embedded. The lamination layer is fastened with aid of a thin bonding sheet or thin resin layer to the conductor layer. The embedding of the component will be implemented by laminating a RCC foil or a b-stage resin layer at the back side of the component. In another embodiment a separate filler material can be used in embedding the component.

The invention provides several advantages. When using relatively thick lamination layer internal strains can be effectively reduced and thus warpage is controlled. The adequate amount of resin for embedding the component is guaranteed by using a b-stage layer, RCC foil or other like precured or uncured layer.

Embodiments that use bonding resin sheets instead of prepregs provide even further advantages over the solutions utilizing prepregs. A CTE of a bonding resin sheet that ties the laminate and conductor layer together can be chosen lower than that of a typical prepreg layer. Furthermore, the bonding resin sheet is typically thinner than a prepreg layer. There are also the following advantages when using a bonding resin sheet. The thinner the bonding resin sheet the thinner the complete electronic module. Further, even if the shrinkage of the material is the same, the strain will be lower due to decreased amount of used b-stage materials. The shrinkage refers to a phenomenon in which materials shrink during the manufacturing process due to other reasons than thermal expansion. Contraction of a material occurs mainly due to polymer curing during the high temperature processes. The lamination layer keeps its dimensions better than a prepreg layer. This provides for the holes for the components to be embedded being even of smaller size and more accurate in positioning than with the prepregs. This also increases silicon area density.

In some embodiments two or several separate lamination layers can be used. In these embodiments the lamination layers can be tied together with the bonding resin sheets, prepreg layers or other similar respective layers.

The composite process according to the embodiment referred to above is, as a totality, simpler than manufacturing a circuit board and attaching a component to the circuit board using, for example, the flip-chip technique. By using such preferred embodiments, the following advantages are obtained, compared to other manufacturing methods:

Soldering is not needed in the connections of the components, instead an electrical connection between the connection zones on the surface of the component and the metal film of the installation base is created by a via-method. This means that the connection of a component does not need metal being maintained molten for a long time with its associated high temperature. Thus, the construction is made more reliable than soldered connections. The brittleness of the metal alloys creates large problems particularly in small connections. In a solderless solution according to a preferred embodiment, it is possible to achieve clearly smaller constructions than in soldered solutions.

As smaller structures can be manufactured using the method, the components can be placed closer together. Thus, the conductors between the components also become shorter and the characteristics of the electronic circuits improve. For example, losses, interferences, and transit-time delays can be significantly reduced.

The method permits a lead-free manufacturing process, which is environmentally friendly.

When using a solderless manufacturing process, fewer undesirable intermetallics also arise, thus improving the long-term reliability of the construction.

The method also permits three-dimensional structures to be manufactured, as the installation bases and the components embedded in them can be stacked on top of each other.

The invention also permits other preferred embodiments. For instance, flexible circuit boards can be used in connection with the invention. Further, in embodiments, in which the temperature of the installation base can be kept low during the entire process, organic manufacturing materials can be used comprehensively.

With the aid of embodiments, it is also possible to manufacture extremely thin structures, in which, despite the thinness of the structure, the components are entirely protected inside their installation base, such as a circuit board.

In embodiments, in which the components are located entirely inside the installation base, the connections between the circuit board and the components will be mechanically durable and reliable.

The embodiments also permit the design of electronic-module manufacturing processes requiring relatively few process stages. Embodiments with fewer process stages correspondingly also require fewer process devices and various manufacturing methods. With the aid of such embodiments, it is also possible in many cases to cut manufacturing costs compared to more complicated processes.

The number of conductive-pattern layers of the electronic module can also be chosen according to the embodiment. For example, there can be one or two conductive-pattern layers. Additional conductive-pattern layers can be manufactured on top of these, in the manner known in the circuit-board industry. A total module can thus incorporate, for example, three, four, or five conductive-pattern layers. The very simplest embodiments have only one conductive-pattern layer and indeed one conductor layer. In some embodiments, each of the conductor layers contained in the electronic module can be exploited when forming conductive patterns.

In embodiments, in which the conductor layer connected to a component is patterned only after the connection of the component, the conductor layer can include conductor patterns even at the location of the component. A corresponding advantage can also be achieved in embodiments, in which the electronic module is equipped with a second conductive-pattern layer, which is located on the opposite surface of the base material of the module (on the opposite surface of the insulation material layer relative to the conductive-pattern layer connected to the component). The second conductor layer can thus also include conductive patterns at the location of the component. The placing of conductive patterns in the conductor layers at the location of the component will permit a more efficient use of space in the module and a denser structure.

In the following, the invention is examined with the aid of examples and with reference to the accompanying drawings.

FIGS. 1-10 show a series of cross-sections of some examples of manufacturing methods according to the invention and schematic cross-sectional diagrams of some electronic modules according to the invention.

FIGS. 12A-19F show a series of embodiments that are specially suited for preventing warpage.

Figure 1:
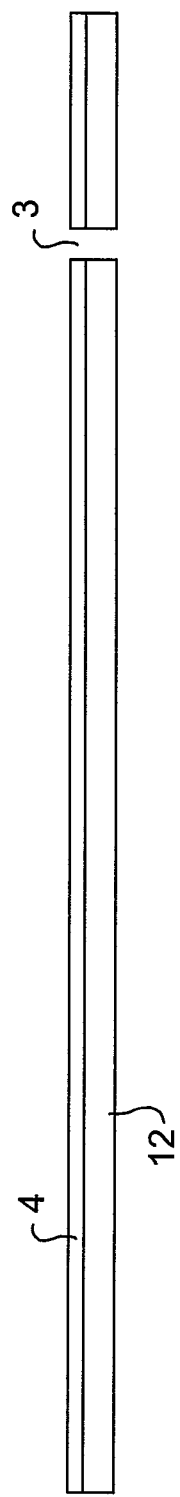
Figure 2:
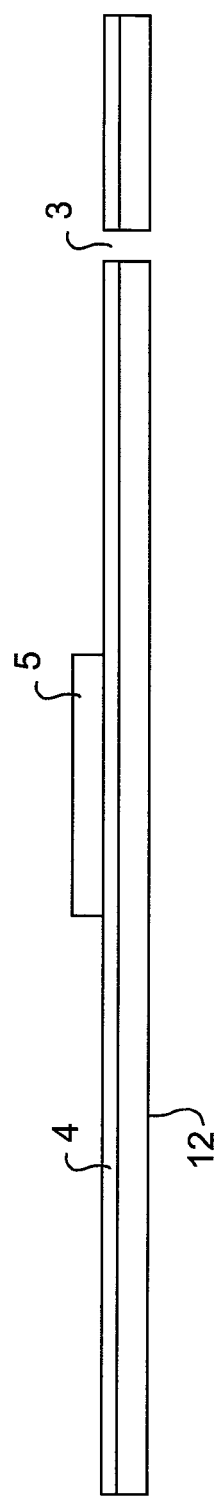
Figure 5:
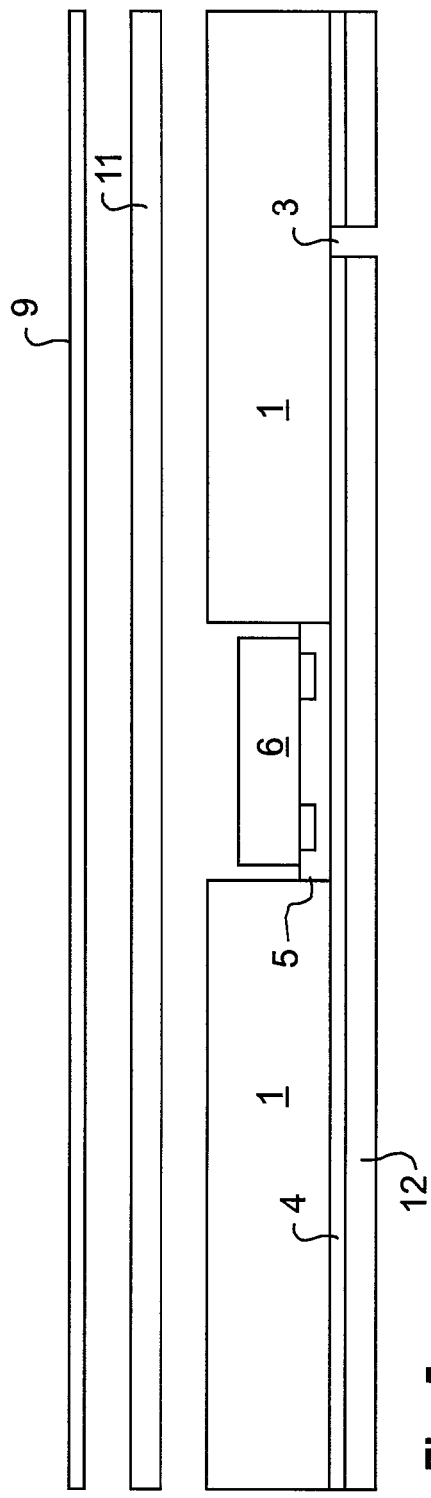
Figure 6:
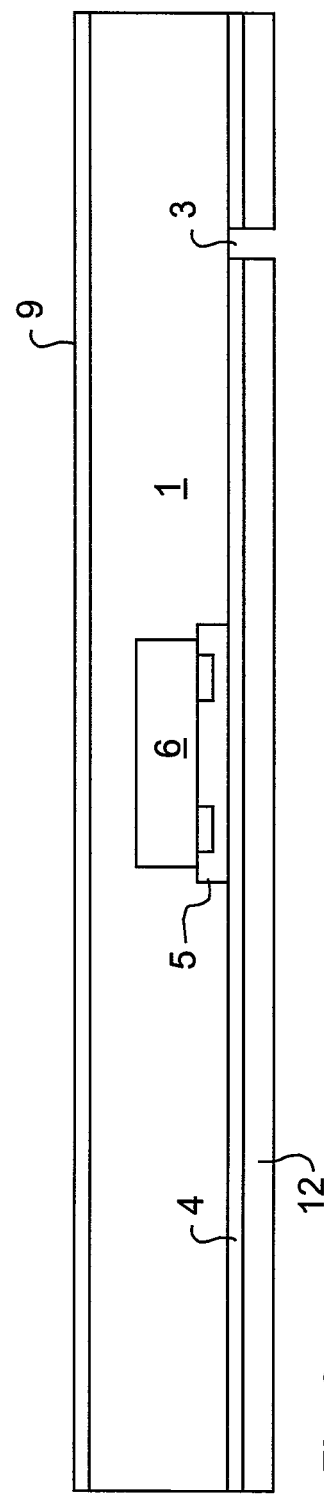
Figure 7:
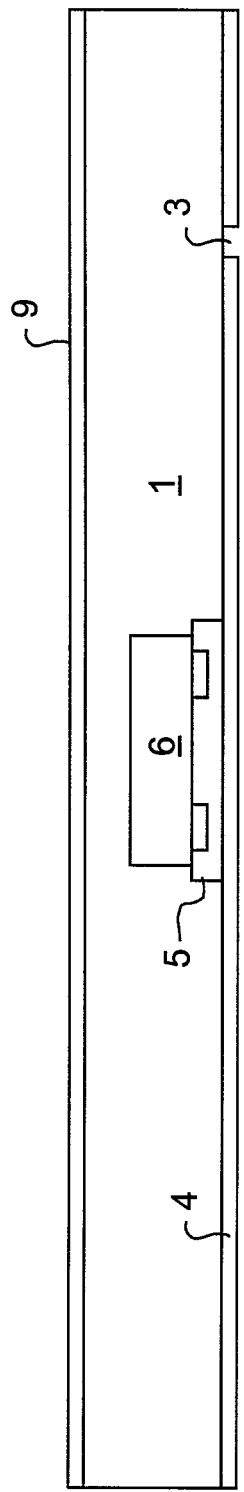
Figure 8:
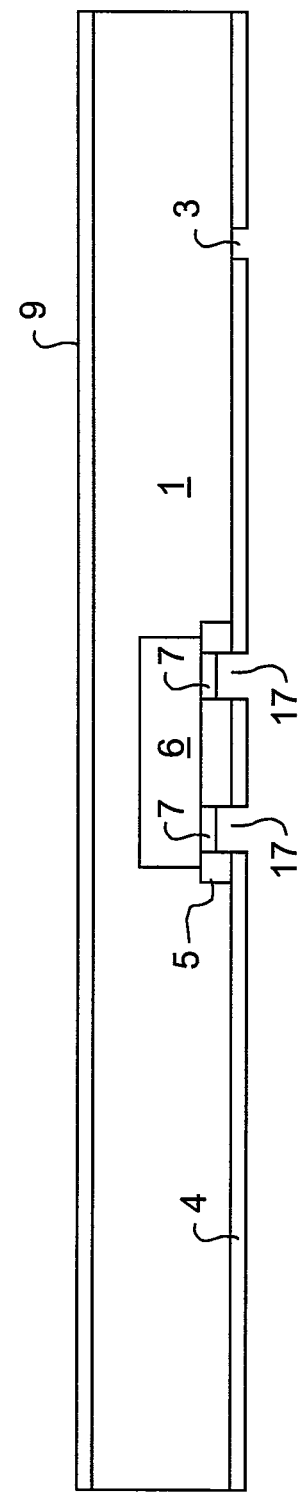

In the methods of the examples, manufacturing starts from a conductive layer 4, which can be, for example, a metal layer. One suitable manufacturing material for the conductive layer 4 is copper film (Cu). If the conductive film 4 selected for the process is very thin, or the conductive film is not mechanically durable for other reasons, it is recommended that the conductive film 4 be supported with the aid of a support layer 12. This procedure can be used, for example, in such a way that the process is started from the manufacture of the support layer 12. This support layer 12 can be, for example, an electrically conductive material, such as aluminium (Al), steel, or copper, or an insulating material, such as a polymer. An unpatterned conductive layer 4 can be made on the second surface of the support layer 12, for example, by using some manufacturing method well known in the circuit-board industry. The conductive layer can be manufactured, for example, by laminating a copper film (Cu) on the surface of the support layer 12. Alternatively, it is possible to proceed by making the support layer 12 on the surface of the conductive layer 4. The conductive film 4 can also be a surfaced metal film, or some other film including several layers, or several materials.

Later in the process, conductive patterns are made from the conductive layer 4. The conductive patterns must then be aligned relative to the components 6. The alignment is most easily performed with the aid of suitable alignment marks, at least some of which can be made already in this stage of the process. Several different methods are available for creating the actual alignment marks. One possible method is to make small through-holes 3 in the conductive layer 4, in the vicinity of the installation areas of the components 6. The same through-holes 3 can also be used to align the components 6 and the insulating-material layer 1. There should preferably be at least two through-holes 3, for the alignment to be carried out accurately.

The components 6 are attached to the surface of the conductive layer 4 with the aid of an adhesive. For gluing, an adhesive layer 5 is spread on the attachment surface of the conductive layer 4, or on the attachment surface of the component 6, or on both. After this, the components 6 can be aligned to the positions planned for the components 6, with the aid of alignment holes 3, or other alignment marks. Alternatively, it is possible to proceed by first gluing the components to the conductive layer 4, positioned relative to each other, and after this making the alignment marks aligned relative to the components. The term attachment surface of the component 6 refers to that surface, which faces the conductive layer 4. The attachment surface of the component 6 includes the contact zones, by means of which an electrical contact can be formed with the component. Thus, the contact zones can be, for example, flat areas on the surface of the component 6, or more usually contact protrusions protruding from the surface of the component 6. There are generally at least two contact zones or protrusions in the component 6. In complex microcircuits, there can be a greater number of contact zones.

In many embodiments, it is preferable to spread so much adhesive on the attachment surface, or attachment surfaces, that the adhesive entirely fills the space remaining between the components 6 and the conductive layer 4. A separate filler is then not required. The filling of the space between the components 6 and the conductive layer 4 reinforces the mechanical connection between the component 6 and the conductive layer 4, thus achieving a structure that is mechanically more durable. The comprehensive and unbroken adhesive layer also supports the conductive patterns 14 to be formed later from the conducting layer 4 and protects the structure during later process stages.

The term adhesive refers to a material, by means of which the components can be attached to the conductive layer. One property of the adhesive is that the adhesive can be spread on the surface of the conductive layer, and/or of the component in a relatively fluid form, or otherwise in a form that will conform to the shape of the surface. Another property of the adhesive is that, after spreading, the adhesive hardens, or can be hardened, at least partly, so that the adhesive will be able to hold the component in place (relative to the conductive layer), at least until the component is secured to the structure in some other manner. A third property of the adhesive is its adhesive ability, i.e. its ability to stick to the surface being glued.

The term gluing refers to the attachment of the component and conductive layer to each other with the aid of an adhesive. Thus, in gluing, an adhesive is brought between the component and the conductive layer and the component is placed in a suitable position relative to the conductive layer, in which the adhesive is in contact with the component and the conductive layer and at least partly fills the space between the component and the conductive layer. After this, the adhesive is allowed (at least partly) to harden, or the adhesive is actively hardened (at least partly), so that the component sticks to the conductive layer with the aid of the adhesive. In some embodiments, the contact protrusions of the component may, during gluing, extend through the adhesive layer to make contact with the conductive layer.

The adhesive used in the embodiments is typically a thermally hardening epoxy, for example an NCA (non-conductive adhesive). The adhesive is selected to ensure that the adhesive used will have sufficient adhesion to the conductive film, the circuit board, and the component. One preferred property of the adhesive is a suitable coefficient of thermal expansion, so that the thermal expansion of the adhesive will not differ too greatly from the thermal expansion of the surrounding material during the process. The adhesive selected should also preferably have a short hardening time, preferably of a few seconds at most. Within this time, the adhesive should harden at least partly, to such an extent that the adhesive is able to hold the component in position. Final hardening can take clearly more time and the final hardening can be planned to take place in connection with later process stages. The adhesive should also withstand the process temperatures used, for example, heating to a temperature in the range 100-265° C. a few times, and other stresses in the manufacturing process, for example, chemical and mechanical stress. The electrical conductivity of the adhesive is preferably in the same order as that of the insulating materials.

A suitable insulating-material layer 1 is selected as the base material of the electronic module, for example, the circuit board. Using a suitable method, recesses, or through-holes are made in the insulating-material layer 1, according to the size and mutual positions of the components 6 to be attached to the conductive layer 4. The recesses or through-holes can also be made to be slightly larger than the components 6, in which case the alignment of the insulating layer 1 relative to the conductive layer 4 will not be so critical. If an insulating-material layer 1, in which through-holes are made for the components 6, is used in the process, certain advantages can be achieved by using, in addition, a separate insulating-material layer 11, in which holes are not made. Such an insulating-material layer 11 can be located on top of the insulating-material layer 1 to cover the through-holes made for the components.

According to another embodiment of the invention insulating-material layer 1, also called core layer in some later embodiments, comprises a core sheet or several core sheets and a bonding layer. The core sheet is typically rigid material which does not change (or changes very little) compared to other materials in a panel, strip, block and even module level during the manufacturing phases. The bonding layer runs at least on the longitudinal surface of the core sheet and is faced towards the conductive layer 4. If several core sheets are used they can be bonded together with respective amount of bonding layers. The function of the core sheet is to keep the panel, strip, block and module as stable as possible during the manufacture. Thus the core layer has relatively low CTE in X-Y direction and low shrinkage during the final pressing or lamination process. The function of the bonding layer is to bond securely the core layer to the conductive layer 4. A separate insulating-material layer 11 may contain filling material that fills the space of a cavity formed through the core layer or the core sheet for a component to be embedded inside the panel, strip, block and module. The separate insulating-material layer 11, also called a filling layer may also contain a second conductive layer 9 on top of the filling layer. The function of the filling layer is to embed the component inside an insulation material with aid of sufficient amount of filler material. The filler material may be activated by heat and pressure or by printing or spreading the filler material inside a cavity.

If it is desired to make a second conductive layer in the electronic module, this can be made, for example, on the surface of the insulating-material layer 1. In embodiments, in which a second conductive layer 9 is used, the conductive layer can be made on the surface of this second conductive layer 9. If desired, conductive patterns 19 can be made from a second conductive layer 9. The conductive layer 9 can be made, for example, in a corresponding manner to the conductive film 4. The manufacture of a second conductive film 9 is not, however, necessary in simple embodiments and when manufacturing simple electronic modules. A second conductive film 9 can, however, be exploited in many ways, such as additional space for conductive patterns and to protect the components 6 and the entire module against electromagnetic radiation (EMC shielding). With the aid of a second conductive film 9 the structure can be reinforced and warping of the installation base, for example, can be reduced.

Feed-throughs, through which electrical contacts can be formed between the contact zones of the components 6 and the conductive layer 4, are made in the electronic module. Holes 17 are made in the conductive layer 4 for the feed-throughs, at the positions of the contact zones (in the figures, the contact protrusions 7) of the components 6. Holes 3, or other available alignment marks can be utilized in the alignment. The holes 17 are made in such a way that they also penetrate through the adhesive layer that has been left on top of the contact zones, or contact protrusions 7. The holes 17 thus extend to the material of the contact protrusions 7 or other contact zones. The holes 17 can be made, for example, by drilling with a laser device, or by using some other suitable method. After this, conductive material is introduced to the hole 17, so that an electrical contact is formed between the components 6 and the conductive layer 4.

The manufacturing processes according to the examples can be implemented using manufacturing methods, which are generally known to those versed in the art of manufacturing circuit boards.

In the following, the stages of the method shown in FIGS. 1-8 are examined in greater detail.

Stage A (FIG. 1):

In stage A, a suitable conductive layer 4 is selected as the initial material of the process. A layered sheet, in which the conductive layer 4 is located on the surface of a support base 12, can also be selected as the initial material. The layered sheet can be manufactured, for example, in such a way that a suitable support base 12 is taken for processing, and a suitable conductive film for forming the conductive layer 4 is attached to the surface of this support base 12.

The support base 12 can be made of, for example, an electrically conductive material, such as aluminium (Al), or an insulating material, such as polymer. The conductive layer 4 can be formed, for example, by attaching a thin metal film to the second surface of the support base 12, for example, by laminating it from copper (Cu). The metal film can be attached to the support base, for example, using an adhesive layer, which is spread on the surface of the support base 12 or metal film prior to the lamination of the metal layer. At this stage, there need not be any patterns in the metal film.

In the example of FIG. 1, holes 3 are made penetrating the support base 12 and the conductive layer 4, for alignment during the installation and connection of the components 6. Two through-holes 3, for example, can be manufactured for each component 6 to be installed. The holes 3 can be made using some suitable method, for example, mechanically by milling, impact, drilling, or with the aid of a laser. However, it is not essential to make through-holes 3, instead some other suitable alignment markings can be used to align the components. In the embodiment shown in FIG. 1, the through-holes 3 used to align the components extend through both the support base 12 and the conductive film 4. This has the advantage that the same alignment marks (through-holes 3) can be used for aligning on both sides of the installation base.

Stage A can also be performed in the same way in embodiments in which a self-supporting conductive layer 4 is used and from which thus totally lacks a support layer 12.

Stage B (FIG. 2):

In stage B, an adhesive layer 5 is spread on those areas of the conductive layer 4, to which the components 6 will be attached. These areas can be termed attachment areas. The adhesive layers 5 can be aligned, for example, with the aid of the through-holes 3. The thickness of the adhesive layer is selected so that the adhesive suitably fills the space between the component 6 and the conductive layer 4, when the component 6 is pressed onto the adhesive layer 5. If the component 6 includes contact protrusions 7, it would be good for the thickness of the adhesive layer 5 to be greater, for example about 1.5-10 times, the height of the contact protrusions 7, so that the space between the component 6 and the conductive layer 4 will be properly filled. The surface area of the adhesive layer 5 formed for the component 6 can also be slightly larger than the corresponding surface area of the component 6, which will also help to avoid the risk of inadequate filling.

Stage B can be modified in such a way that the adhesive layer 5 is spread on the attachment surfaces of the components 6, instead of on the attachment areas of the conductive layer 4. This can be carried out, for example, by dipping the component in adhesive, prior to setting it in place in electronic module. It is also possible to proceed by spreading the adhesive on both the attachment areas of the conductive layer 4 and on the attachment surfaces of the components 6.

The adhesive being used is thus a electrical insulator, so that electrical contacts are not formed in the actual adhesive layer 5, between the contact zones (contact protrusions 7 in the example) of the component 6.

Stage C (FIG. 3):

In stage C, the component 6 is set in place in the electronic module. This can be done, for example, by pressing the components 6 into the adhesive layer 5, with the aid of an assembly machine. In the assembly stage, the through-holes 3 made for alignment, or other available alignment marks, are used to align the components 6.

The components 6 can be glued individually, or in suitable groups. The typical procedure is for the conductive layer, which can be termed the bottom of the installation base, to be brought to a suitable position relative to the assembly machine, and after this the component 6 is aligned and pressed onto the bottom of the installation base, which is held stationary during the aligning and attaching.

After this phase the manufactured intermediate part is called as a base layer 50.

Stage D (FIG. 4):

In stage D, an insulating-material layer 1, in which there are pre-formed recesses 2 or recesses for the components 6 to be glued to the conductive layer 4, is placed on top of the conductive layer 4. The insulating-material layer 1 can be made from a suitable polymer base, in which recesses or cavities according to the size and position of the components 6 are made using some suitable method. The polymer made can be, for example, a pre-preg base known and widely used in the circuit-board industry, which is made from a glass-fibre mat and so-called b-state epoxy. It is best to perform stage D only once the adhesive layer 5 has been hardened, or it has otherwise hardened sufficiently for the components 6 to remain in place during the placing of the insulating-material layer 1.

When manufacturing a very simple electronic module, the insulating-material layer 1 can be attached to the conductive layer 4 in connection with stage D and the process continued with the patterning of the conductive layer 4.

Stage E (FIG. 5):

In stage E, an unpatterned insulating-material layer 11 is placed on top of the insulating-material layer 1 and on top of it a conductive layer 9. Like the insulating-material layer 1, the insulating-material layer 11 can be made from a suitable polymer film, for example, the aforesaid pre-preg base. The conductive layer 9 can, in turn, be, for example, a copper film, or some other film suitable for the purpose.

Stage F (FIG. 6):

In stage F, the layers 1, 11, and 9 are pressed with the aid of heat and pressure in such a way that the polymer (in the layers 1 and 11) forms a unified and tight layer between the conductive layer 4 and 9 around the components 6. The use of this procedure makes the second conductive layer 9 quite smooth and even.

When manufacturing simple electronic modules and those including a single conductive-pattern layer 14, stage E can even be totally omitted, or the layers 1 and 11 can be laminated to the construction, without a conductive layer 9.

Stage G (FIG. 7):

In stage G, the support base 12 is detached or otherwise removed from the construction. Removal can take place, for example, mechanically or by etching. Stage G can naturally be omitted from embodiments that do not employ a support base 12.

Stage H (FIG. 8):

In stage H, holes 17 are made for the feed-throughs. The holes 17 are made through the conductive layer 4 and the adhesive layer 5, in such a way that the material of the contact protrusions 7, or other contact zones of the components 6 is exposed. The holes 17 can be made, for example, by drilling with a laser. The holes 17 can be aligned, for example, with the aid of holes 3.

Figure 9:
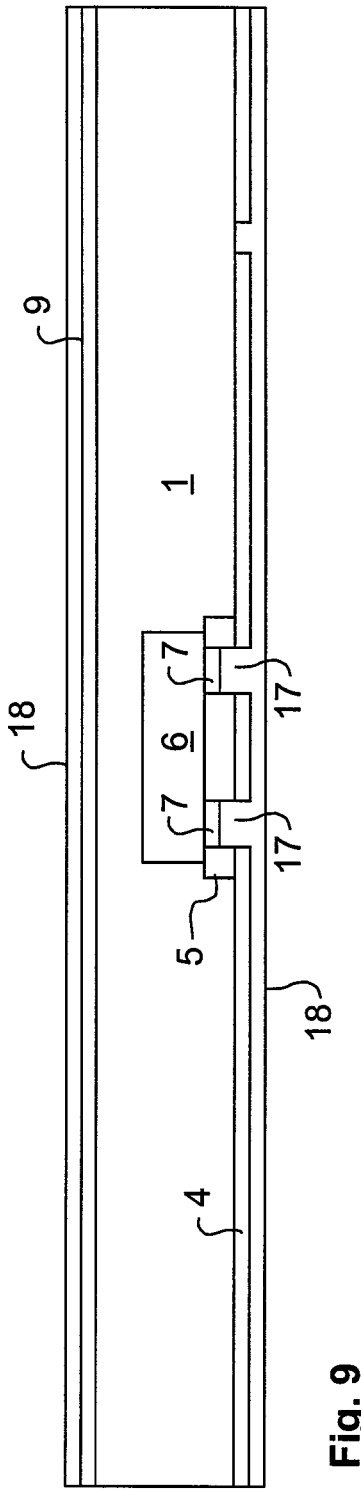

Stage I (FIG. 9):

In stage I, conductive material 18 is grown into the holes 17 made in stage H. In the example process, the conductive material is grown at the same time also elsewhere on top of the base, so that the thickness of the conductive layers 4 and 9 also increases.

The conductive material 18 being grown can be, for example, copper, or some other sufficiently electrically conductive material. The choice of conductive material 18 should take into account the ability of the material to form an electrical contact with the contact protrusions 7 of the component 6. In one example process, the conductive material is mainly copper. Copper-metallizing can be performed by surfacing the holes 17 with a thin layer of chemical copper and then continuing the surfacing using an electrochemical copper-growing method. Chemical copper is used, for example, because it also forms a surface on top of the adhesive and acts as an electrical conductor in electrochemical surfacing. The growth of the metal can thus be performed using a wet-chemical method, in which case the growing will be cheap.

In the example process, the holes 17 of the feed-throughs are first cleaned using a three-stage desmear treatment. After this, the feed-throughs are metallized in such a way that an SnPd coating catalysing the polymer is first formed, after which a thin layer (about 2 μm) is deposited on the surface. The thickness of the copper is increased using electrochemical deposition.

Stage I is intended to form an electrical contact between the component 6 and the conductive layer 4. In stage I, it is therefore not essential to increase the thickness of the conductive layers 4 and 9, instead the process can equally well be planned in such a way that in stage I the holes 17 are only filled with a suitable material. The conductive layer 18 can be made, for example, by filling the holes 17 with an electrically conductive paste, or by using some other metallizing method suitable for micro-vias.

In the later figures, the conductive layer 18 is shown with the conductive layers 4 and 9 merged.

Stage J (FIG. 10):

In stage J, the desired conductive patterns 14 and 19 are formed from the conductive layers 4 and 9 on the surface of the base. If only a single conductive layer 4 is used in the embodiment, the patterns are formed on only one side of the base. It is also possible to proceed in such a way that the conductive patterns are only formed from the conductive layer 4, even though a second layer 9 is also used in the embodiment. In such an embodiment, the unpatterned conductive layer 9 can act, for example, as a mechanically supporting or protective layer of the electronic module, or as a protection against electromagnetic radiation.

The conductive patterns 14 can be made, for instance, by removing the conductive material of the conductive layer 4 from outside of the conductive patterns. The conductive material can be removed, for example, using one of the patterning and etching methods that are widely used and well known in the circuit-board industry.

Figure 10:
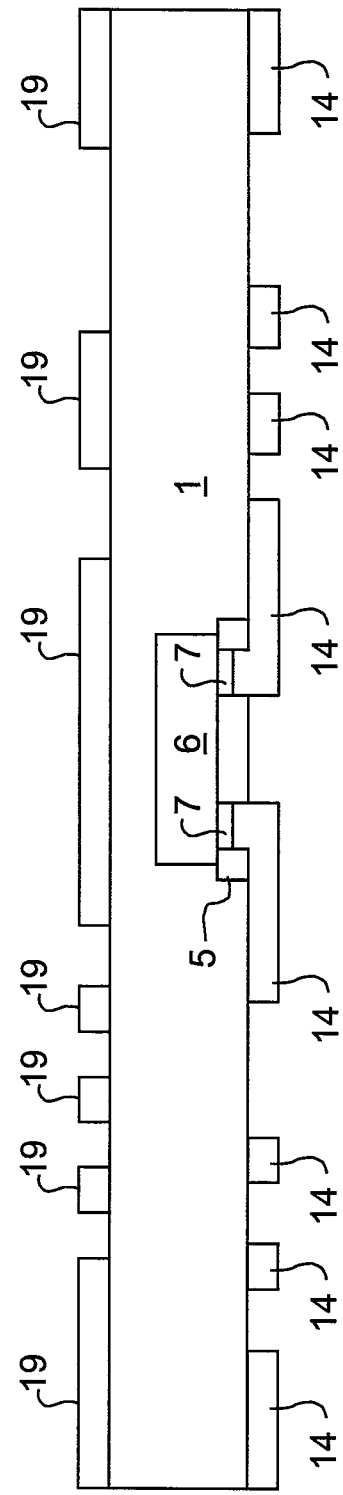

After stage J, the electronic module includes a component 6, or several components 6 and conductive patterns 14 and 19 (in some embodiments only conductive patterns 14), with the aid of which the component or components 6 can be connected to an external circuit, or to each other. The conditions for manufacturing a functional totality then exist already. The process can thus be designed in such a way that the electronic module is already finished after stage J and FIG. 10 shows one example of a possible electronic module that can be manufactured using the example methods. If it is wished, the process can also continue after stage J, for example, by surfacing the electronic module with a protective substance, or by making additional conductive patterns on the first and/or second surface of the electronic module.

FIG. 11

Figure 11:
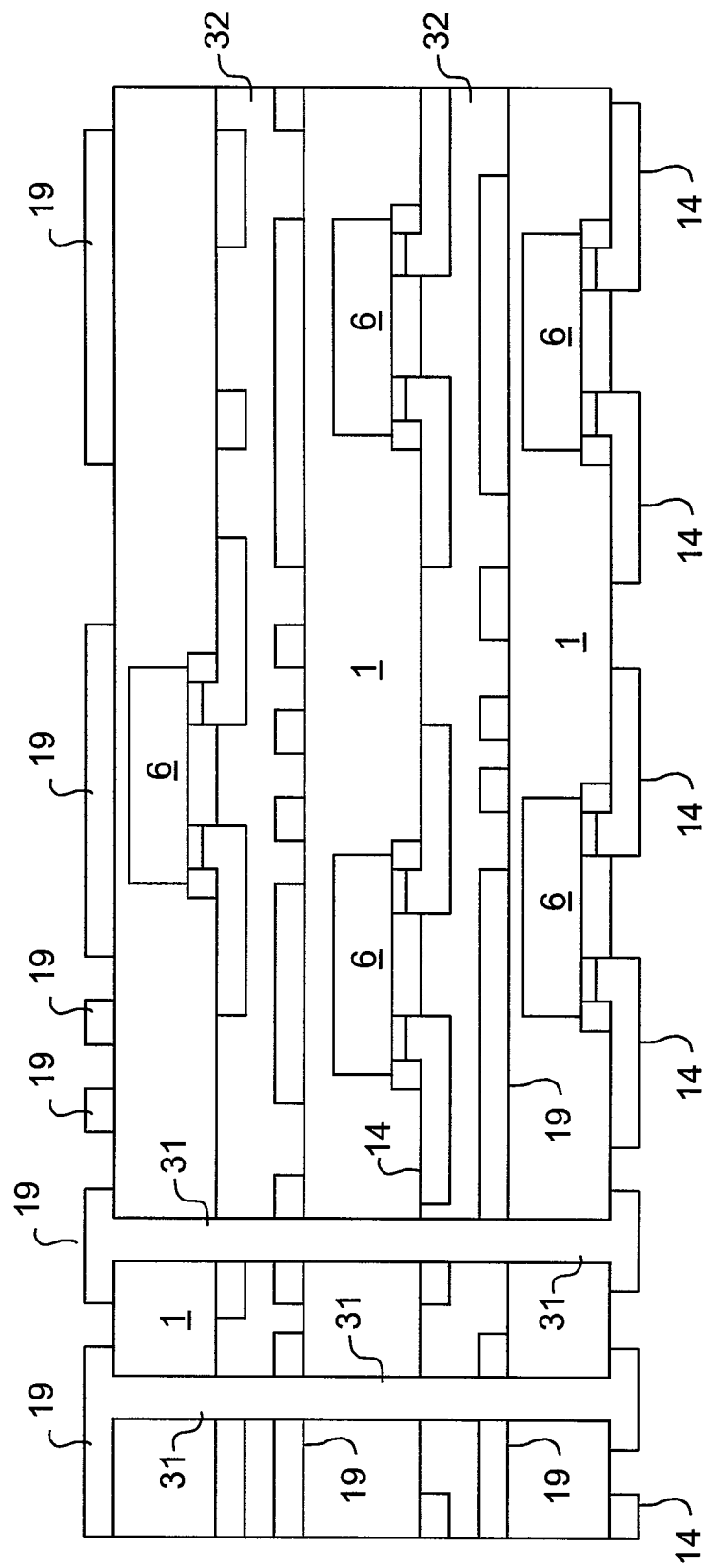
FIG. 11 shows a cross-sectional view of one electronic module according to the invention, which includes several installation bases on top of each other.

FIG. 11 shows a multi-layered electronic module, which includes three bases 1 laminated on top of each other, together with their components 6, and a total of six conductive-pattern layers 14 and 19. The bases 1 are attached to each other with the aid of intermediate layers 32. The intermediate layer 32 can be, for example, a pre-preg epoxy layer, which is laminated between the installation bases 1. After this, holes running through the module are drilled in the electronic module, in order to form contacts. The contacts are formed with the aid of a conductive layer 31 grown in the holes. With the aid of the conducts 31 running through the electronic module, the various conductive-pattern layers 14 and 19 of the installation bases 1 can be suitably connected to each other, thus forming a multi-layered functioning totality.

On the basis of the example of FIG. 11, it is clear that the method can also be used to manufacture many different kinds of three-dimensional circuit structures. The method can be used, for example, in such a way that several memory circuits are placed on top of each other, thus forming a package containing several memory circuits, in which the memory circuits are connected to each other to form a single functional totality. Such packages can be termed three-dimensional multichip modules. In modules of this kind, the chips can be selected freely and the contacts between the various chips can be easily manufactured according to the selected circuits.

The sub-modules (bases 1 with their components 6 and conductors 14 and 19) of a multi-layered electronic module can be manufactured, for example, using one of the electronic-module manufacturing methods described above. Some of the sub-modules to be connection to the layered construction can, of course, be quite as easily manufactured using some other method suitable for the purpose.

After the base layer 50 (FIG. 3) has been manufactured there are several possibilities to construct reliable, warpage controlled electronic modules 100 in panel, strip, block and module level containing embedded components. The base layer 50 contains the conductive layer 4 which preferably comprises one or two or several metal layers, made of copper for instance. One of the layers can be a copper carrier foil and another can be the functional conductive film of which the final conductive patterns 14 are made from. The thickness of the copper carrier foil is between 18 to 105 micrometers (or even thicker), preferably 35 to 70 micrometers. The thickness of the functional conductive film is between 1 to 18 micrometers, preferably 1 to 5 micrometers in case of two or several metal layer conductive layer 4. In case of one layer conductive film, the thickness of the functional conductive film is between 9 to 105, preferably 18 to 35 micrometers. On top of the conductive layer 4 at the side where the component 6 will be attached and between the adhesive layer 5 and the conductive layer 4 there may be a thin insulation layer 56, for example a thin resin layer, to make a better adhesion and insulation between the core layer 60 and the base layer 50. The thickness of the thin insulation layer 56 is between 1 to 60 micrometers, preferably 3 to 20 micrometers. The base layer 50 contains also a component 6 on top of the conductive layer 4 to be embedded inside the core 60 and filling 70 layers.

The following embodiments describe the structural examples of warpage controlled electronic modules 100.

According to an embodiment of the invention, the insulating-material layer 1 or the core layer 60 (in later embodiments), comprises core sheet 62 and a bonding layer 64 at least on the longitudinal surface of the core sheet 62 towards the conductive layer 4 or the thin insulation layer 56.

The function of the core sheet 62 is to keep the electronic module 100 as stable as possible during the manufacture. Thus the core sheet 62 has relatively low CTE. The core sheet 62 may be for example totally cured epoxy sheet or sheets also called as c-stage epoxy. Also other materials can be used such as typical PCB laminate e.g. FR-2, FR-3, FR-4, FR-5, BT, Aramid or other reinforced polymer sheet or other suitable material. The core sheet 62 can be manufactured from one, two or several prepreg layers with aid of heat and pressure. A desired and very precise thickness can be easily achieved by knowing the thickness and CTE values of prepreg layers and used heat and pressure during the manufacture phase, i.e. curing treatment. The thickness of a core sheet 62 may vary between 30 to 600 micrometers. Furthermore, the core sheet 62 may comprise several separate core sheets or layers. The core sheet 62 can also be a prefabricated single or multilayer PCB.

The function of the bonding layer 64 is to bond securely the core sheet 62 to the base layer 50. The bonding layer 64 may be for example a thin layer of insulation material that also contains good adhesive properties, e.g. ABF (Ajinomoto Build-up film), Adflema (Namics bonding film) or other typically epoxy based bonding film. The thickness of a bonding layer 64 may vary between 3 to 60 micrometers, preferably between 15 to 30 micrometers. The bonding layer 64 can be laminated over the rigid core sheet by vacuum treatment, for example.

Yet in another embodiment the bonding layer 64 may contain high CTE material to control and compensate warpage in an electronic module 100. The elastic bonding film 64 is laminated over the base layer 50 after the cavity manufacturing and before installation of a core sheet 62. In this example the high CTE bonding film will cover also the component to be embedded.

In a preferred embodiment thickness of the core layer 60 can be chosen such that the core layer 60 is as thick as the component 6 to be embedded, or slightly thicker. These dimensions guarantee that in any circumstance the component 6 to be embedded will not be damaged, for example during pressing phase. The thickness of the core layer 60 may also be thinner than the component to be embedded. This is very useful embodiment when the backside of the component will be left open. Such embodiments are for example MEMS, efficient heat conducting, or other like purposes.

After that, the holes 66 for components 6 to be embedded are formed through the core layer 60. In a preferred embodiment of the invention, the holes 66 are slightly larger than the components 6, for example the holes 66 may be 150 micrometers larger per side than the components 6 to be embedded.

According to an embodiment of the invention a separate insulating-material layer 11, which is called a filling layer 70 in later embodiments, contains filling material 72 that fills the hole 66 earlier formed through the lamination layer 60 for a component 6 to be embedded inside the electronic module 100. The filling layer 70 may also contain a second conductive layer 9 on top of the filling material 72. The second conductive layer 9 may be similar than the conductive layer 4 of the base layer 50. The function of the filling layer 70 is to embed the component 6 inside an insulation material with aid of sufficient amount of filler material 72. The filler material 72 may be activated by heat and pressure or by printing or spreading the filler material inside the cavity. Suitable filling layer 70 is resin coated carrier (RCC) for example. For embodiments printing or spreading the filler material into the hole 66 a high CTE resin is recommended to be used.

The figure series 12 presents an example of panel, strip, block and module level items according to an embodiment of the invention.

The figure series 13-19 present several embodiments of manufacturing warpage controlled electronic modules containing an embedded component.

Warpage as a phenomenon occurs also in larger level than within an individual electronic module. Furthermore, warpage can be detected especially after the heat and pressure treatment within a manufacturing process of electronic modules. At this intermediate phase of manufacture, electronic products can be for example in blocks, strips or panels of which each contains tens, hundreds or even thousands of electronics modules.

FIG. 12A presents a top view of a panel 90 according to an embodiment of the invention. The panel 90 comprises ten separate strips 92, for example. Panel level warpage occurs for example as a gentle bend on the whole way of a panel 90. There can be also other types of panel level warpage. Panel level warpage may occur especially when there are lots of different types of embedded components within a panel or the population of used embedded components of a panel is on a high level, high silicon area density. When manufacturing electronic modules after the panel 90 is made ready, the strips 92 are separated apart from the panel 90 by means of a router, dicing saw or laser, for example. Panel size may vary a lot; a panel size can be 454×549 millimeters, for instance.

FIG. 12B presents a top view of a strip 92 according to an embodiment of the invention. The strip 92 comprises three separate blocks 94, for example. Strip level warpage occurs similarly like panel level warpage as gentle bending on the whole way of the strip 92. There can also be other types of strip level warpage. Strip level warpage may occur especially when there are lots of different types of embedded components within a strip or the population of used embedded components of a strip is on a high level, high silicon area density. If needed blocks 94 can be separated apart from the strip 92 by means of a router, dicing saw or laser, for example. Strip size may vary a lot; a typical strip size can be 240×74 millimeters, for instance.

FIG. 12C presents a top view of a block 94 according to an embodiment of the invention. The block 94 comprises sixteen separate modules 100, for example. Block level warpage occurs similarly like panel or strip level warpage as gentle bending on the whole way of a block 94. There can also be other types of block level warpage. Block level warpage may occur especially when there are lots of different types of embedded components within a block or the population of used embedded components of a block is on a high level, high silicon area density. Modules 100 are separated apart from the block 94 by means of a router, dicing saw or laser, for example. Block size may vary a lot; a typical block size can be 75×67 millimeters, for instance.

FIG. 12D presents a top view of a module 100 according to an embodiment of the invention. The module 100 comprises at least one embedded semiconductor component 6. There can be several semiconductor components 6 within one module 100. Module level warpage occurs similarly like panel, strip or block level warpage as gentle bending on the whole way of the module 100. There can also be other types of module level warpage. Module level warpage may occur in asymmetric designs wherein there is only one conductive pattern layer or asymmetric PCB structure or embedded semiconductor components are not positioned in the center line of the module 100 or embedded semiconductor components 6 are large sized compared to the whole module 100 or used substrate layers comprise an unbalanced structure. Module size may vary a lot; a typical module size can be from 5×5 to 15×15 millimeters, for instance. As is obvious, electronic modules need not to be shaped as squares. As is obvious for a skilled person in the art, the dimensions of different types of electronic products can be changed and some intermediate products or phases can be avoided or not used. This can happen when no blocks are present in a strip, for example. And vice versa, the strips may contain the modules.

Figure 13A:
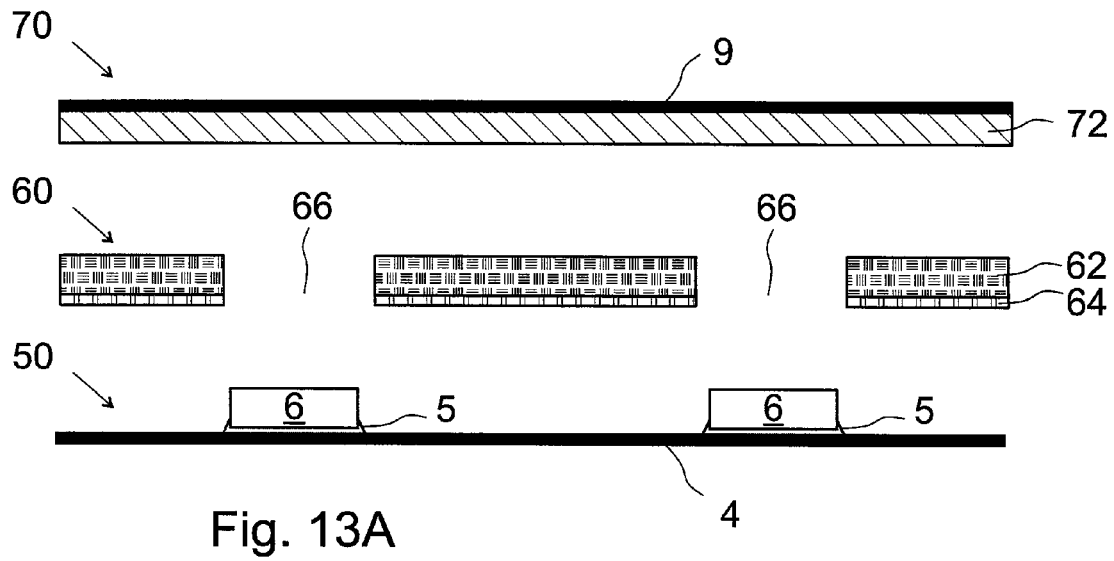

FIG. 13A shows a first alternative embodiment of the invention to embed a component 6 in an electronic module 100. A base layer 50, a core layer 60 and a filling layer 70 are stacked up together in the following order. The core layer 60 is stacked up on the base layer 50 at the side of the component 6 so that the bonding layer 64 fastens with the conductive layer 4. The filling layer 70 is stacked on the core layer 60 at the side of the core sheet 62.

Figure 13B:
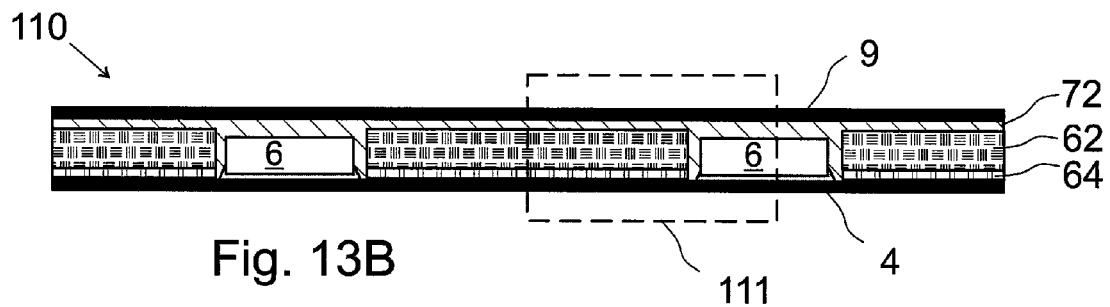

FIG. 13B shows when the stacked base layer 50, core layer 60 and filling layer 70 are pressed together. During this phase the bonding layer 64 fastens tightly the base layer 50 and the core layer 60 together. During the pressing process the filler material 72 becomes viscose and flows into the hole 66 and fills the hole 66 and embeds the component 6 inside the electronic module 110.

Figure 13C:
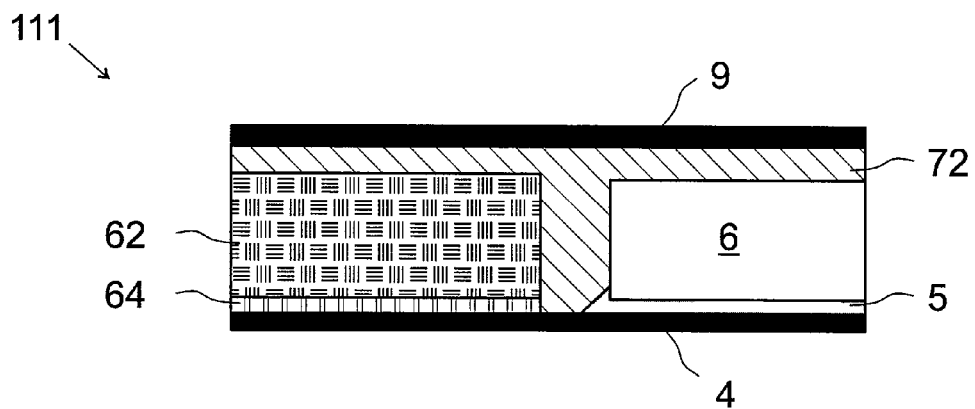

FIG. 13C shows a partial enlargement 111 of the structure of the electronic module 110 after the phase of pressing. After the phase of pressing the manufacturing may continue with the phase G (FIG. 7) described above.

Figure 13D:
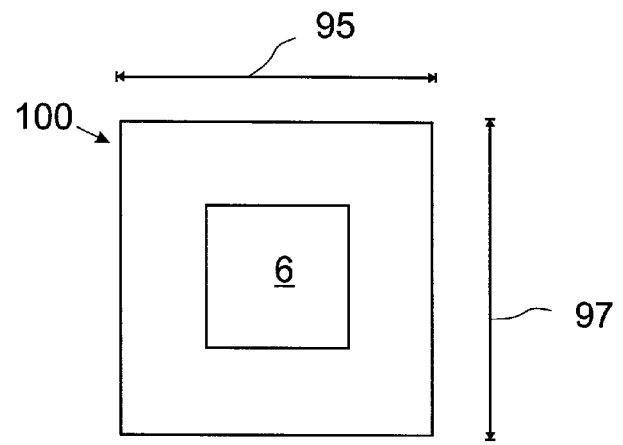

FIG. 13D shows a top view of an electronic module 100 manufactured according to the FIGS. 13A to 13C. Depending on the design the component 6 is embedded either in the centre point both in X-direction 95 and Y-direction 97 or off-centered in X-direction 95 or Y-direction 97 or both. The component 6 may also be rotated in any angle (according to X-Y center point), if required by the design.

Figure 13E:
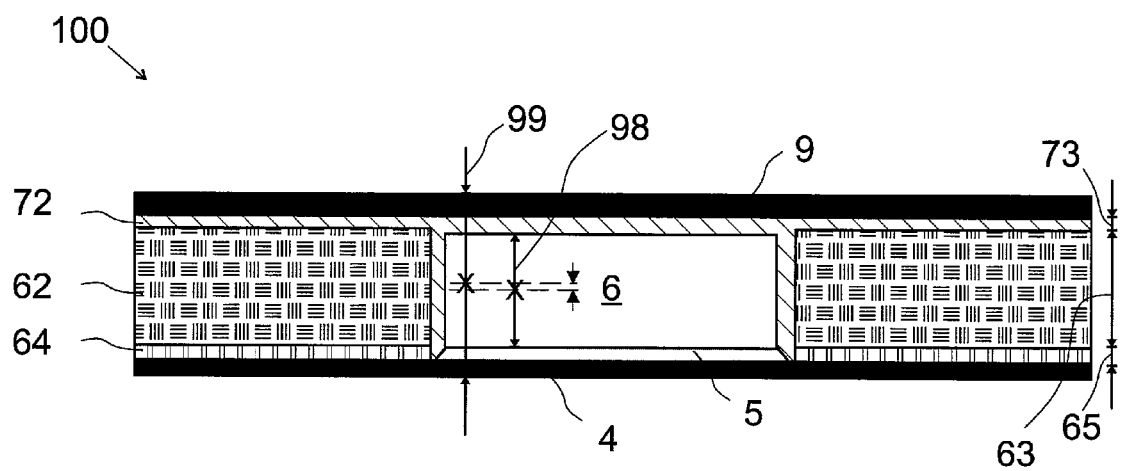

FIG. 13E shows a cross section view of the electronic module 100 of FIG. 13D. In an ideal embodiment the embedded component 6 is positioned in a centre point also in the Z-direction 99. Due to different CTE values, material properties, adhering of the materials and materials' behaviour during and after the manufacturing of an electronic module 100 the zero stress centre point 98 of the component 6 in Z-direction may differ from the dimensional centre point. Thus it is preferable to adjust the embedded component 6 in the centre point 98 in Z-direction by taking into account the dimensions of the component 6, the amount and thickness of used adhesive 5 and the thicknesses of the core sheet 62, bonding layer 64, filling layer 72 and thin resin layer 56 (if available/used). By varying these dimensions and especially the thickness 63 of core sheet 62 and the thickness 73 of filling layer 72 very compact embedded component packages can be manufactured in a warpage controlled way. Similarly, by varying the thickness 65 of the bonding layer 64 the warpage can be controlled. The zero stress centre point (i.e. the centre point of the component 6 related to dimensional centre point of the electronic module 100 where the internal stress is zero) of an embedded component 6 in relation with the other layers used in the electronic module 100 can be adjusted also by varying different material features and manufacturing process.

The manufacturing process comprises several manufacturing process steps which are done in different process temperatures. During the manufacturing process different materials are adhering to each other in different temperatures and in different process phases. Due to the CTE mismatch and differences in adhering temperatures the zero stress temperature of different material interfaces or layers varies and due to that also the residual stress in different material interfaces or layers varies and might cause warpage in e.g. operating temperature. The zero stress temperature is a temperature where the materials are adhered to each other and the stress caused by the CTE mismatch is minimal. This temperature can be different for different interfaces and layers if the adhering has occurred during different process phase or temperatures.

In some embodiments component thickness can be freely adjusted during component preparation process steps (wafer grinding and thinning). It should be noted that thickness of some component (e.g. discrete passives) is fixed by the component manufacturer and due to that might define the minimum thickness of the final module. In preferred embodiments the thickness of the thickest component determines the minimum core thickness because of the miniaturization requirements. In certain embodiments some of the embedded components may be thinner than the core sheet. In the latter case the Z-direction of the thinner components can be adjusted in desired manner by achieving improved product warpage.

For example, the adhesive layer 5 within the base layer 50 is totally cured when the final pressing and heating is started during the phase according to FIG. 13B, for example. Same matters also the core sheet 62 and the conductive layers 4 and 9 due to the material behaviour and CTE features.

Figure 13F:
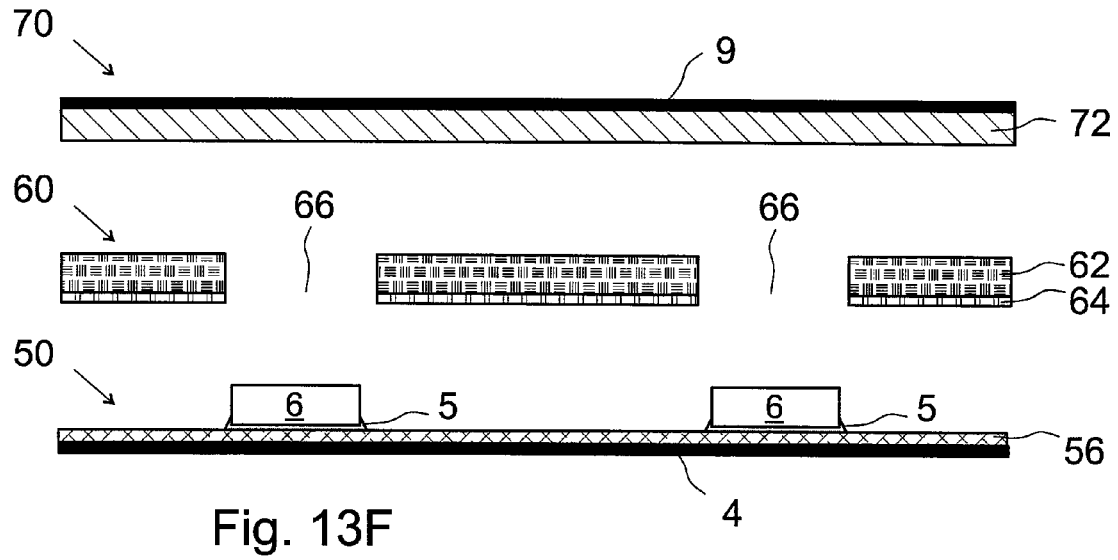
Figure 13G:
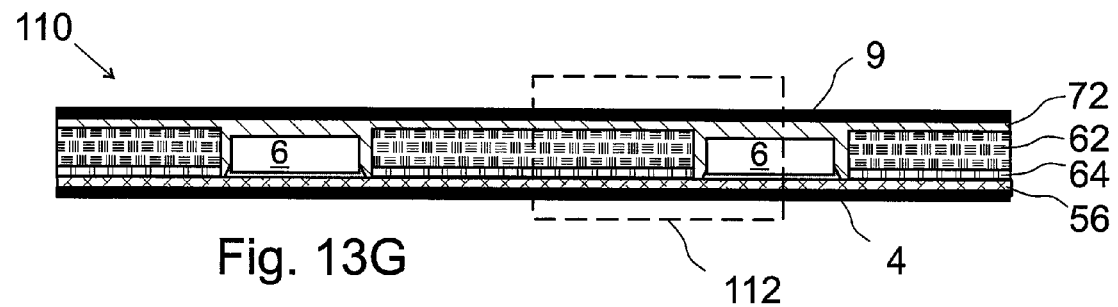
Figure 13H:
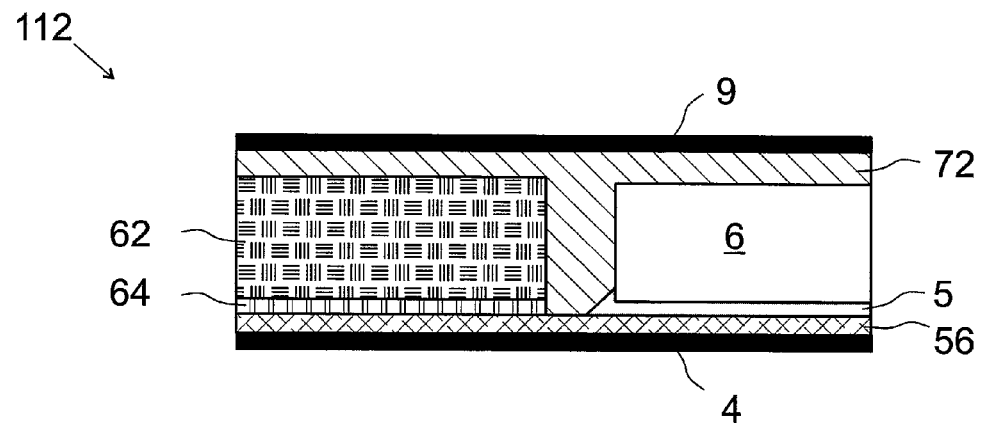

FIGS. 13F-13H show a variation of the first alternative embodiment described in the FIGS. 13A-13C. A thin insulation layer 56 runs on the longitudinal surface of the base layer 50. The thin insulation layer 56 is between the conductive layer 4 and the adhesive layer 5 attaching the component 6. The purpose of the thin insulation layer 56 is to give even more proper adhesion in some cases between the base layer 50 and the core layer 60. The following embodiments and partial enlargements show structures where a thin insulation layer 56 is both present and not. A person skilled in the art notices that in every embodiment a thin insulation layer 56 may be used or omitted with the base layer 50. Furthermore, similarly the thin insulation layer 56 can be used with the filling layer 70 structure between the filler material 72 and the second conductive layer 9.

FIG. 13H shows a partial enlargement 112 of the structure of the variation of the first alternative embodiment of the electronic module 110 after the phase of pressing. After the phase of pressing the manufacturing may continue with the phase G (FIG. 7) described above.

Figure 14A:
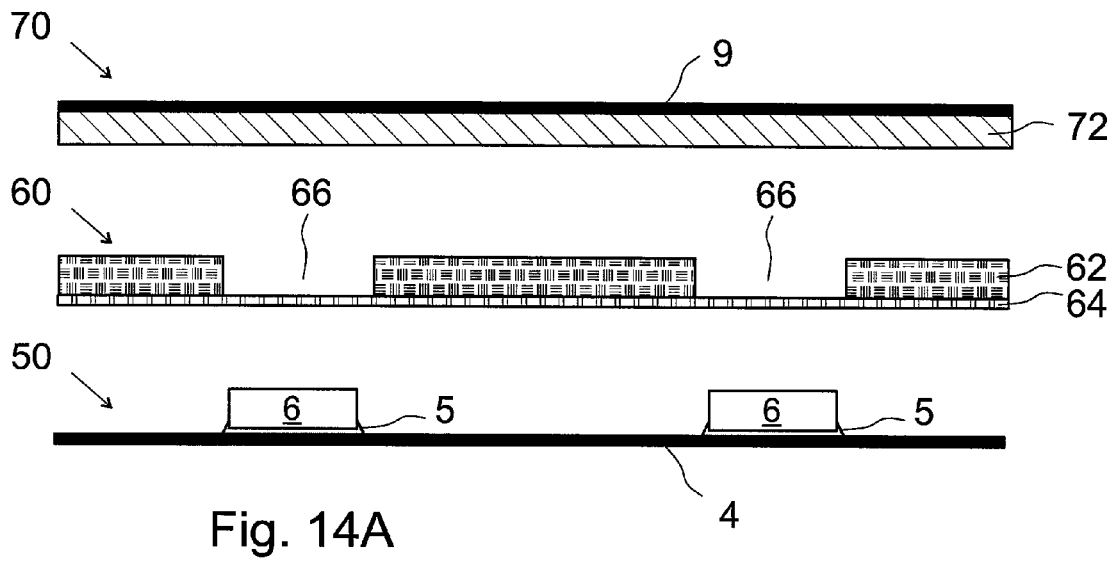

FIG. 14A shows a second alternative embodiment of the invention to embed a component 6 in an electronic module 120. A base layer 50, a core layer 60 and a filling layer 70 are stacked up together in the following order. Departing from the first alternative embodiment the holes 66 for the components 6 are formed through the core sheet 62 only. After forming the holes 66 an elastic bonding layer 64 is laminated with the core sheet 62. The core layer 60 is stacked up on the base layer 50 at the side of the component 6 so that the bonding layer 64 fastens with the conductive layer 4 and also covers the component 6. The filling layer 70 is stacked on the core layer 60 at the side of the core sheet 62.

Figure 14B:
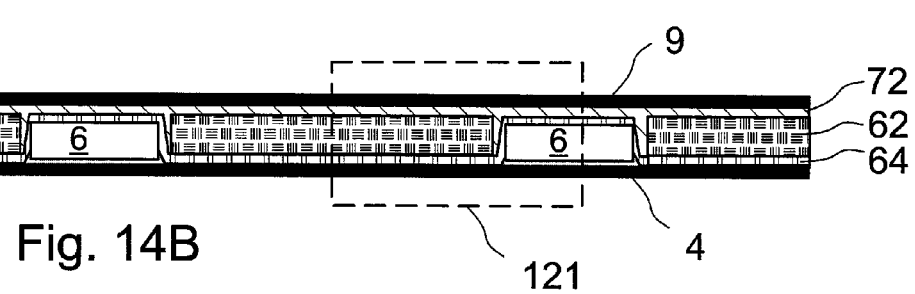

FIG. 14B shows when the stacked base layer 50, core layer 60 and filling layer 70 are pressed together. During this phase the bonding layer 64 fastens the base layer 50 and the core layer 60 together. The elastic bonding layer 64 will stretch on top of the contour of the component 6 to cover it entirely. At the same time the filler material 72 becomes active and will flow into the hole 66 by filling the free space.

Figure 14C:
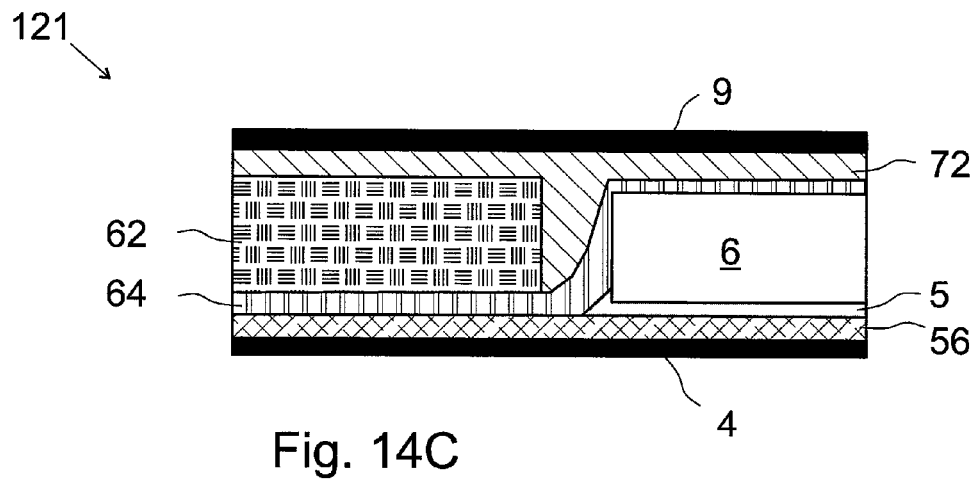

FIG. 14C shows a partial enlargement 121 of the structure of the electronic module 120 after the phase of pressing. After the phase of pressing the manufacturing may continue with the phase G (FIG. 7) described above.

Figure 15A:
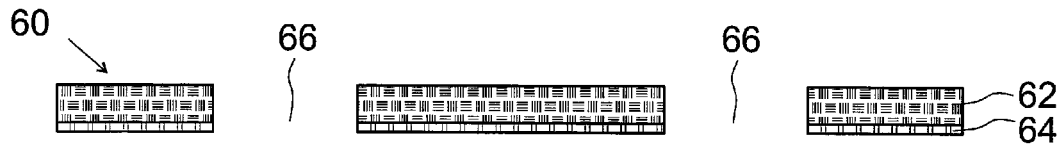

FIG. 15A shows a third alternative embodiment of the invention to embed a component 6 in an electronic module 130. A base layer 50 is prepared as shown with the FIGS. 1-3. A core layer 60 is prepared by stacking a core sheet 62 and bonding layer 64 together using e.g. vacuum lamination. After that, the holes 66 for the components 6 to be embedded are formed through the whole core layer 60.

Figure 15B:

FIG. 15B shows when the base layer 50 and the core layer 60 are stacked up together in the following order. The core layer 60 is stacked up on the base layer 50 at the side of the component 6 so that the bonding layer 64 fastens temporarily with the conductive layer 4.

Figure 15C:
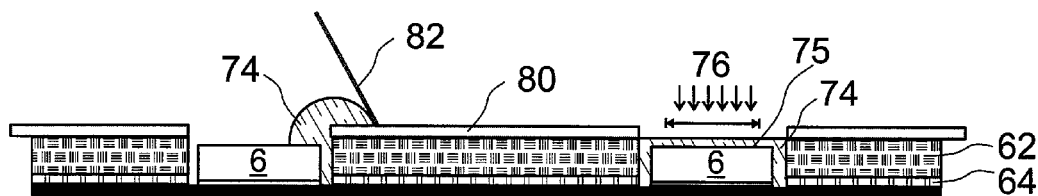

FIG. 15C shows the phase of embedding the components. A stencil 80 is put on top of the core layer and filler material 74 is printed or spread into the holes 66 with aid of spreading means 82, a squeegee. After filling the filler material 74 the stencil 80 will be removed. If desired the back side 75 of the component 6 can be revealed or the filler material 74 removed 76 in a later phase partially or totally. This can be done mechanically or by etching or laser ablation, for instance. The filler material 74 can also be applied using e.g. a dispensing or other spreading method. After the phase, the manufacturing may continue with the phase G (FIG. 7) described above.

Figure 15D:
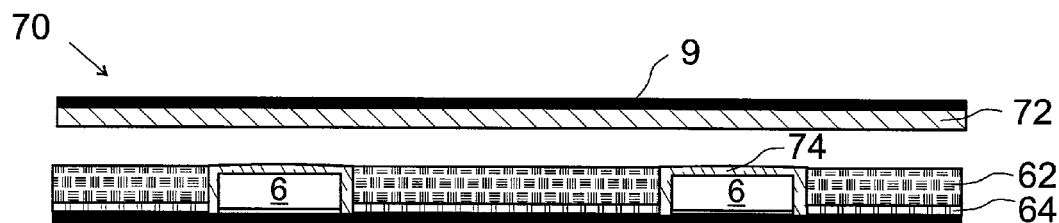

FIG. 15D shows an alternative variation of the third embodiment of the invention. After filling the holes 66 with filler material 74, a cover layer 70 including the second conductive layer 9 is placed on top of the core layer 60.

Figure 15E:
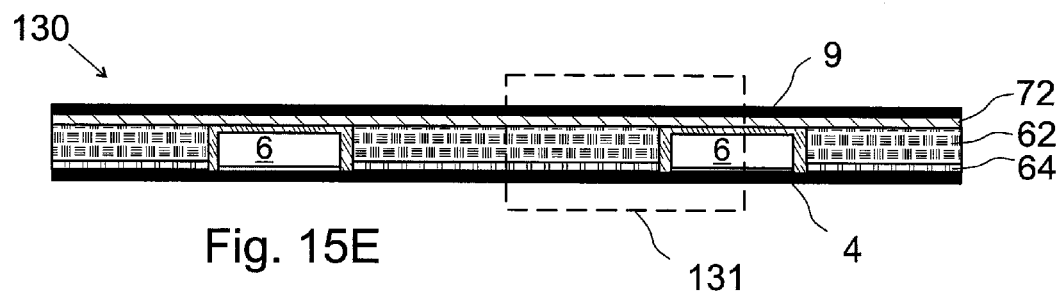

FIG. 15E shows when the stacked base layer 50, core layer 60 and cover layer 70 are pressed together as an electronic module 130. During this phase the temporarily bonded bonding layer 64 fastens tightly the base layer 50 and the core layer 60 together. At the same time an attaching material 72 becomes active and fastens towards the core layer 60 and the filler material 74.

Figure 15F:
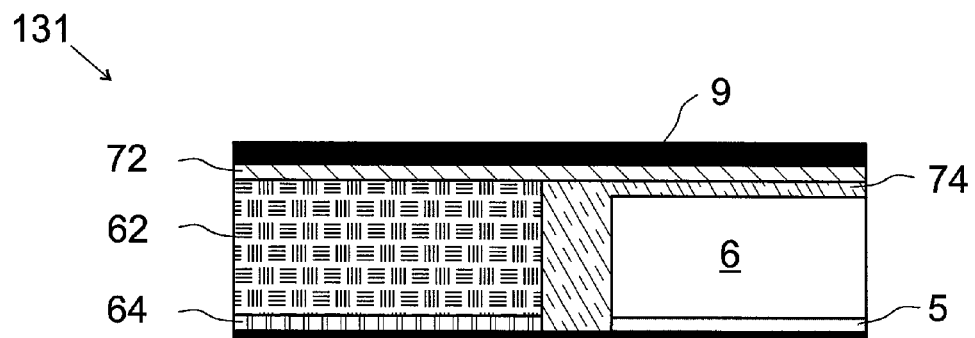

FIG. 15F shows a partial enlargement 131 of the structure of the electronic module 130 after the phase of pressing. After the phase of pressing the manufacturing may continue with the phase G (FIG. 7) described above.

Figure 15G:
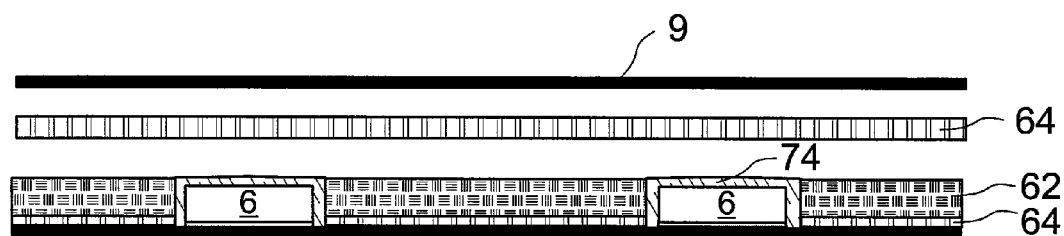

FIG. 15G shows yet an alternative variation of the third embodiment of the invention. After filling the holes 66 with filler material 74, a second bonding layer 64 will be lightly laminated over the core layer 60. After that, a separate conductive layer 9 is laminated over the second bonding layer 64.

Figure 15H:
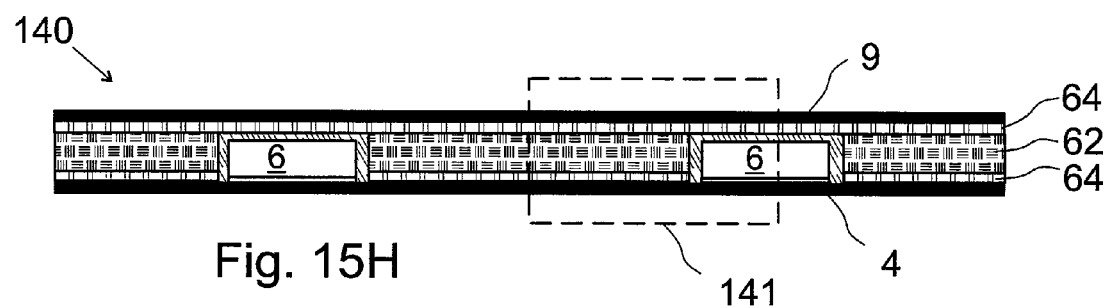

FIG. 15H shows when the stacked base layer 50, core layer 60, second bonding layer 64 and separate conductive layer 9 are pressed together as an electronic module 140. During this phase the lightly bonded bonding layer 64 fastens tightly the base layer 50 and the core layer 60 together. At the same time the second bonding layer 64 fastens towards the core layer 60 and the separate conductive layer 9.

Figure 15I:
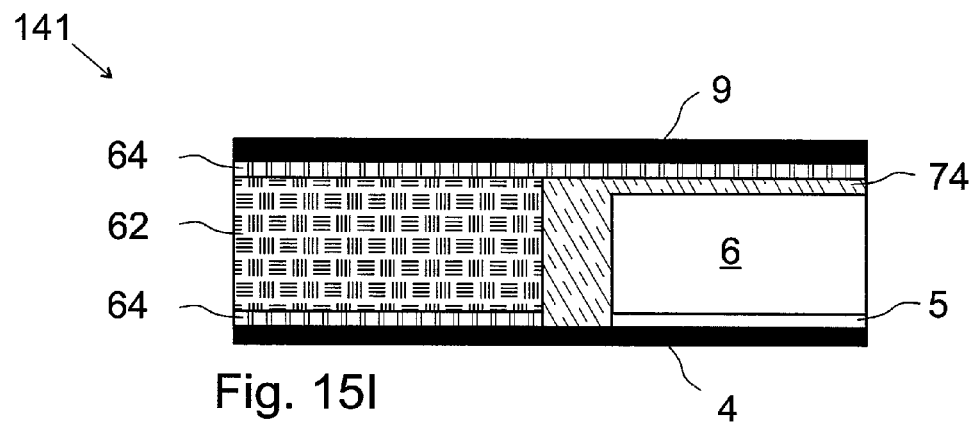

FIG. 15I shows a partial enlargement 141 of the structure of the electronic module 140 after the phase of pressing. After the phase of pressing the manufacturing may continue with the phase G (FIG. 7) described above.

Figure 16A:
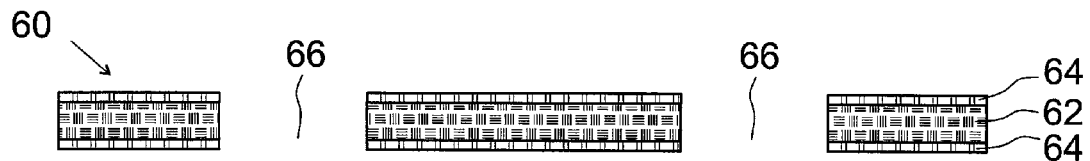

FIG. 16A shows a fourth alternative embodiment of the invention to embed a component 6 in an electronic module 150. A base layer 50 is prepared as shown with the FIGS. 1-3. A core layer 60 is prepared by stacking two bonding layers 64 on opposite sides of a core sheet 62 with aid of vacuum treatment, for example. After that, the holes 66 for the components 6 to be embedded are formed through the whole core layer 60.

Figure 16B:

FIG. 16B shows when the base layer 50 and the core layer 60 are stacked up together in the following order. The core layer 60 is stacked up on the base layer 50 at the side of the component 6 so that the first bonding layer 64 fastens only lightly with the conductive layer 4.

Figure 16C:
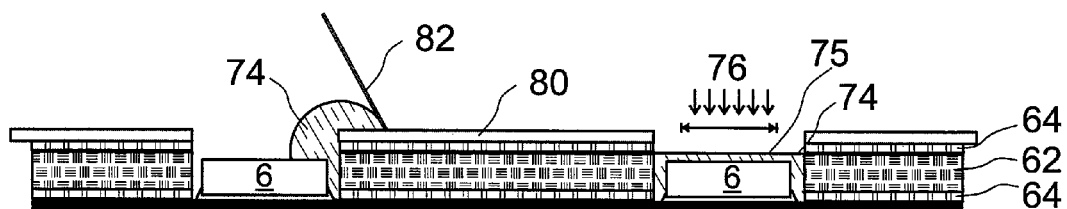

FIG. 16C shows the phase of embedding the components. A stencil 80 is put on top of the core layer and filler material 74 is printed or spread into the holes 66 with aid of spreading means 82, a squeegee for example. After filling the filler material 74 the stencil 80 will be removed. If desired the back side 75 of the component 6 can be revealed or the filler material 74 removed 76 partially or totally. This can be done mechanically or by etching or laser ablation, for instance. After the phase the manufacturing may continue with the phase G (FIG. 7) described above.

Figure 16D:
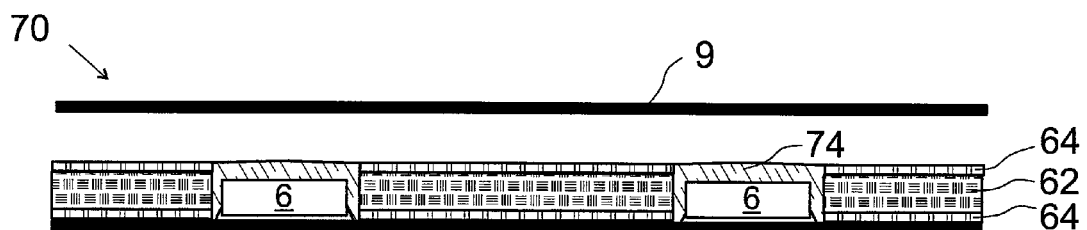

FIG. 16D shows an alternative variation of the fourth embodiment of the invention. After filling the holes 66 with filler material 74 a cover layer 70 including the second conductive layer 9 is placed on top of the core layer 60.

Figure 16E:
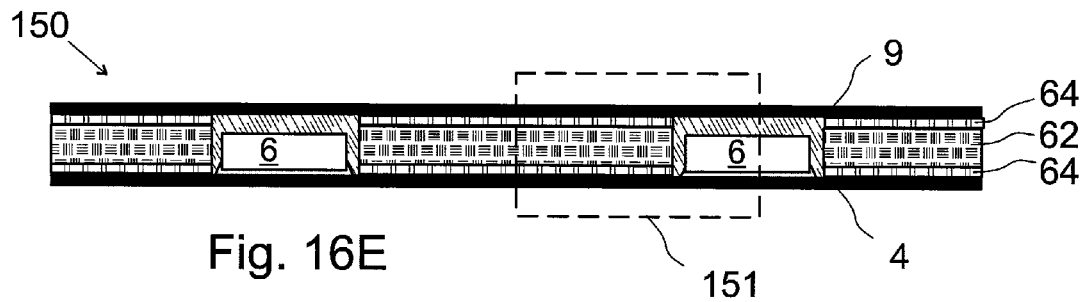

FIG. 16E shows when the stacked base layer 50, core layer 60 and cover layer 70 are pressed together as an electronic module 150. During this phase the lightly bonded first bonding layer 64 fastens tightly the base layer 50 and the core layer 60 together. At the same time the second bonding layer 64 fastens tightly the core layer 60 and the cover layer 70 together.

Figure 16F:
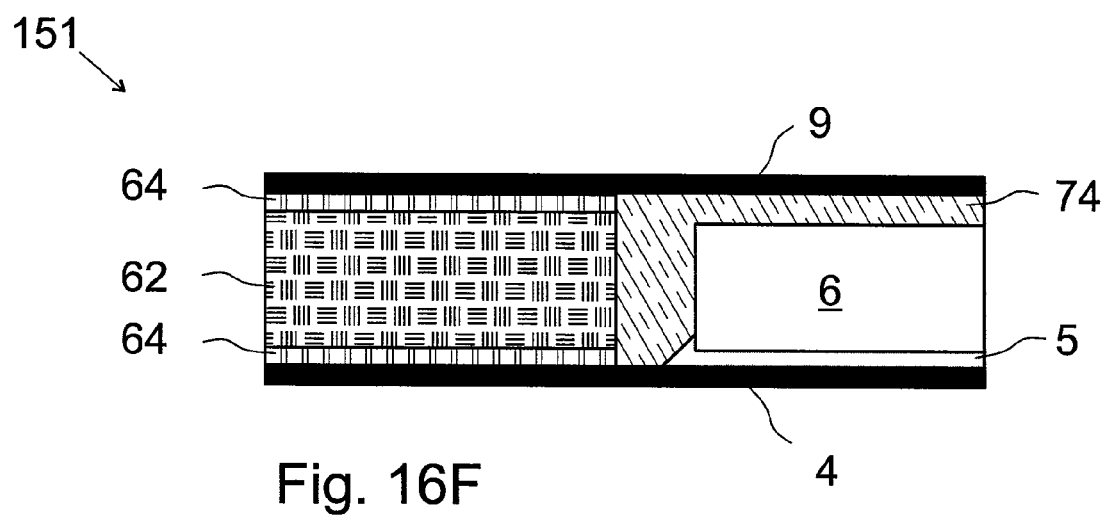

FIG. 16F shows a partial enlargement 151 of the structure of the electronic module 150 after the phase of pressing. After the phase of pressing the manufacturing may continue with the phase G (FIG. 7) described above.

Figure 16G:
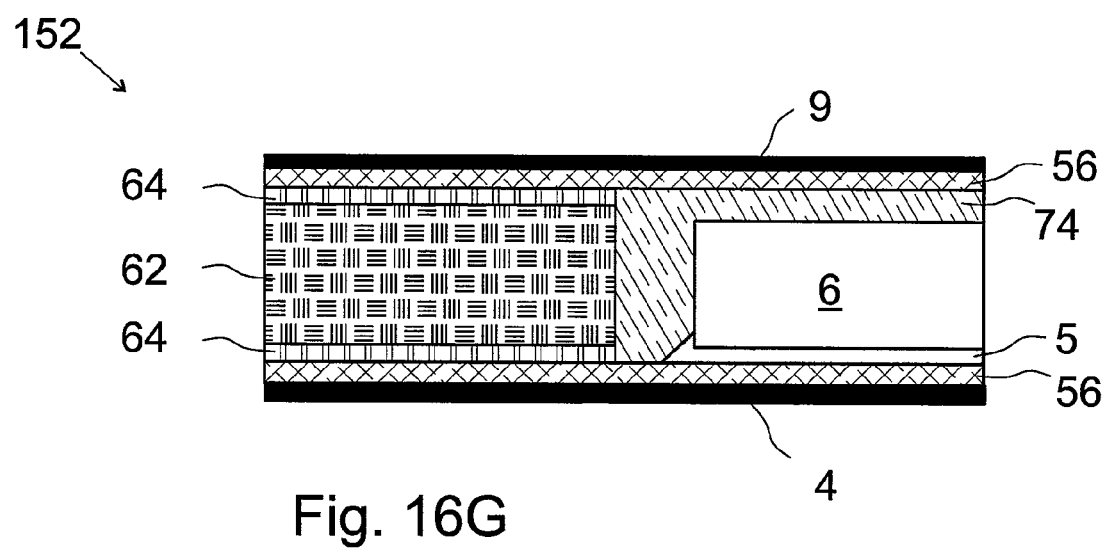

FIG. 16G shows a partial enlargement 152 of the structure of the electronic module 150 after the phase of pressing. In this example thin insulation layers 56 are used within the base layer 50 and filling layer 70. After the phase of pressing the manufacturing may continue with the phase G (FIG. 7) described above.

Figure 17A:

FIG. 17A shows a fifth alternative embodiment of the invention to embed a component 6 in an electronic module 160. A base layer 50 is prepared as shown with the FIGS. 1-3.

Figure 17B:
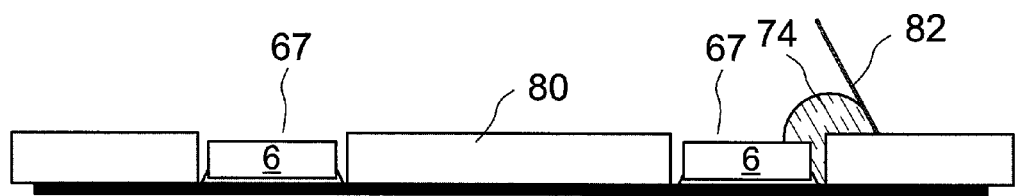

FIG. 17B shows the phase of embedding the components. A stencil 80 is put on top of the conductor layer 4 of the base layer 50. In this embodiment the height of the stencil 80 can be chosen equal or higher to the height of the embedded component 6 with the encapsulating filler material 74. The filler material 74 is printed or spread into the holes 67 of the stencil 80 with aid of spreading means 82, a squeegee for example.

Figure 17C:
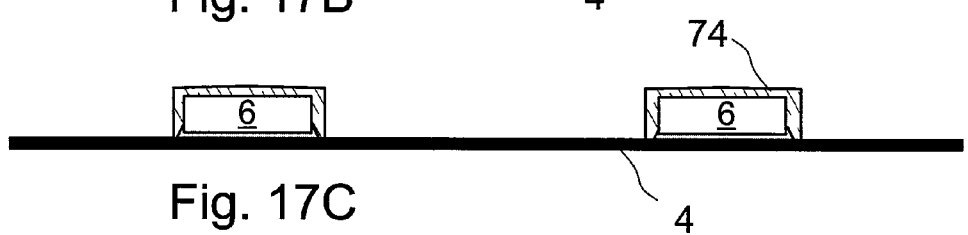

FIG. 17C shows the phase after the stencil 80 has been removed. During this phase the filler material 74 can also be fully cured or semi-cured using heat or UV or other suitable method that is recommended for the used material.

Figure 17D:
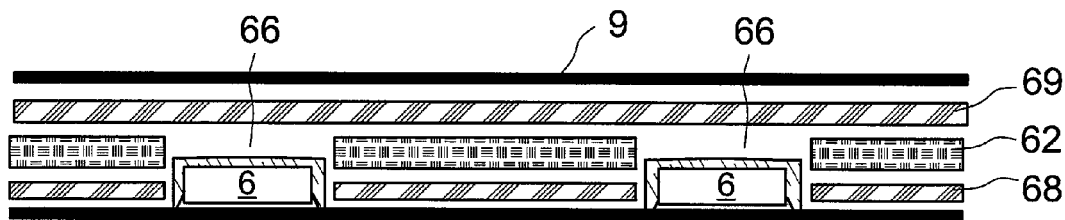

FIG. 17D shows the phase of stacking insulation material layers on top of the base layer 50. The holes 66 for the component 6 to be embedded are formed e.g. mechanically or by laser to the insulation material layer 68 and a core sheet 62. A unified separate insulation material sheet 69 is stacked on top of the core sheet 62. The holes 66 are formed large enough that the resin of the insulation material layer 68 and unified insulation material sheet 69 will freely flow and cure. The materials of the insulation material layer 68 and unified insulation material sheet 69 can be prepreg, for example. On top of the unified insulation material sheet 69 the second conductive layer 9 will be laminated to the electronic module 160.

Figure 17E:
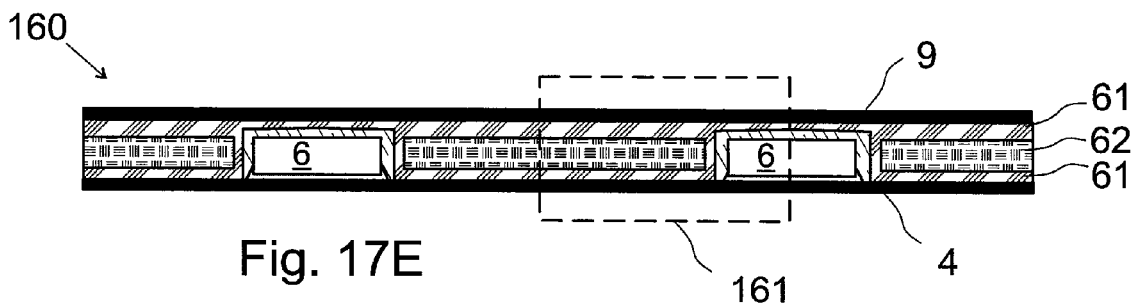

FIG. 17E shows when the stacked insulation material layer 68, core sheet 62 and unified insulation material sheet 69 are pressed together as an electronic module 160. During this phase the insulation material layer 68 and unified insulation material sheet 69 will be cured and they form one cured layer 61 enclosing both the component 6 and the core sheet 62.

Figure 17F:
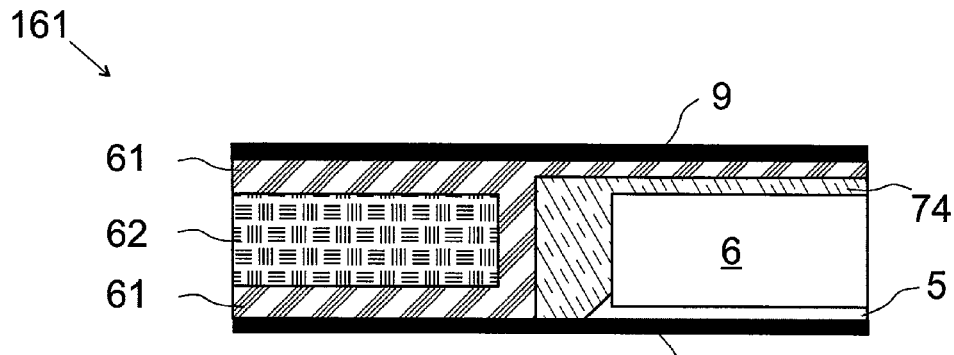

FIG. 17F shows a partial enlargement 161 of the structure of the electronic module 160 after the phase of pressing. After the phase of pressing, the manufacturing may continue with the phase G (FIG. 7) described above.

Figure 17G:
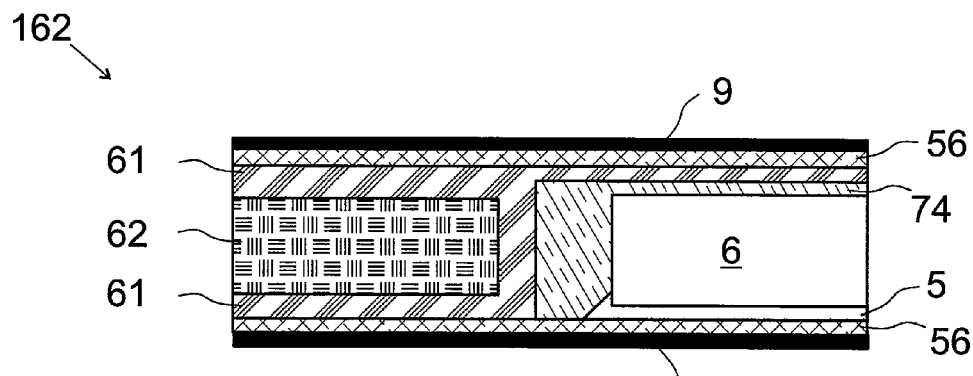

FIG. 17G shows a partial enlargement 162 of the structure of the electronic module 160 after the phase of pressing. In this example thin insulation layers 56 are used within the base layer 50 and between the unified insulation material sheet 69 and the second conductive layer 9. After the phase of pressing the manufacturing may continue with the phase G (FIG. 7) described above.

Figure 17H:
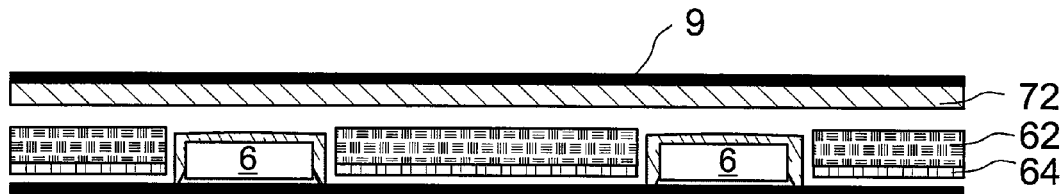

FIG. 17H shows an alternative variation of the fifth embodiment of the invention. After encapsulating the component 6, the insulation layer is formed by stacking a core layer 60 and a filling layer 70. The core layer 60 comprises a core sheet 62 and a bonding layer 64. The filling layer 70 comprises filler material 72 and the second conductive layer 9.

Figure 17I:
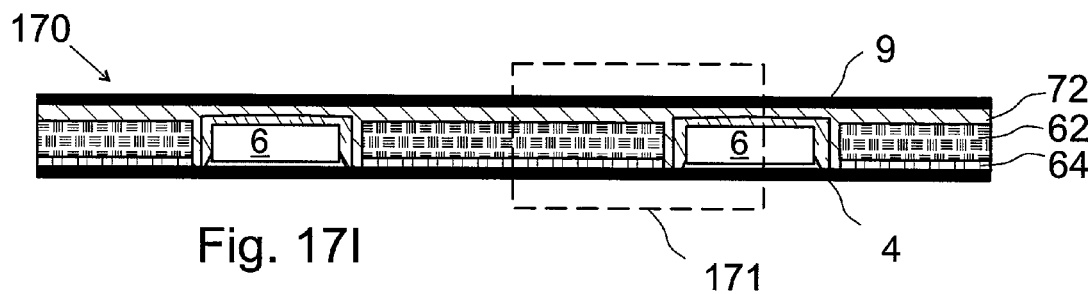

FIG. 17I shows when the stacked base layer 50 with encapsulated component 6, core layer 60 and filling layer 70 are pressed together as an electronic module 170. During this phase the bonding layer 64 fastens tightly the base layer 50 and the core layer 60 together. At the same time the filler material 72 of the filling layer 70 becomes active and will flow into the free space between the core layer 60 and the encapsulation 74 of the component 6.

Figure 17J:
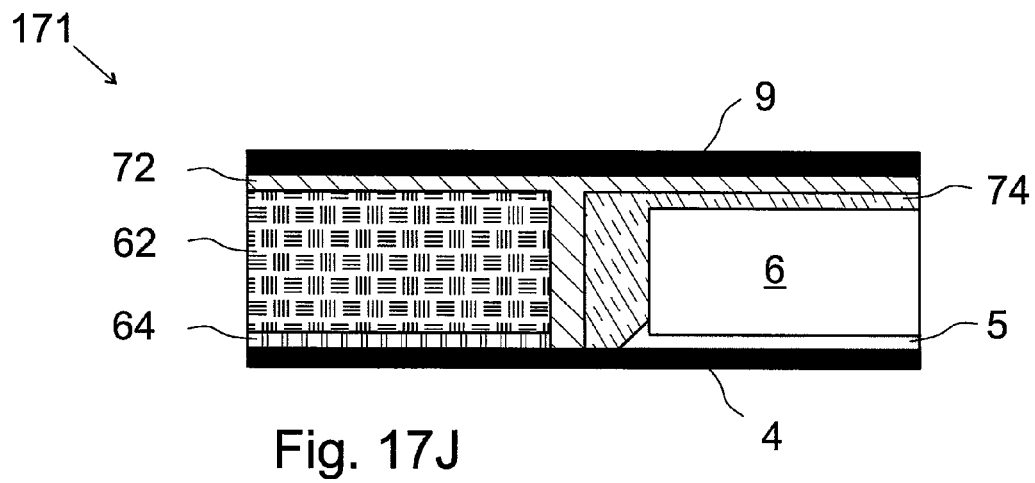

FIG. 17J shows a partial enlargement 171 of the structure of the electronic module 170 after the phase of pressing. After the phase of pressing the manufacturing may continue with the phase G (FIG. 7) described above.

Figure 17K:
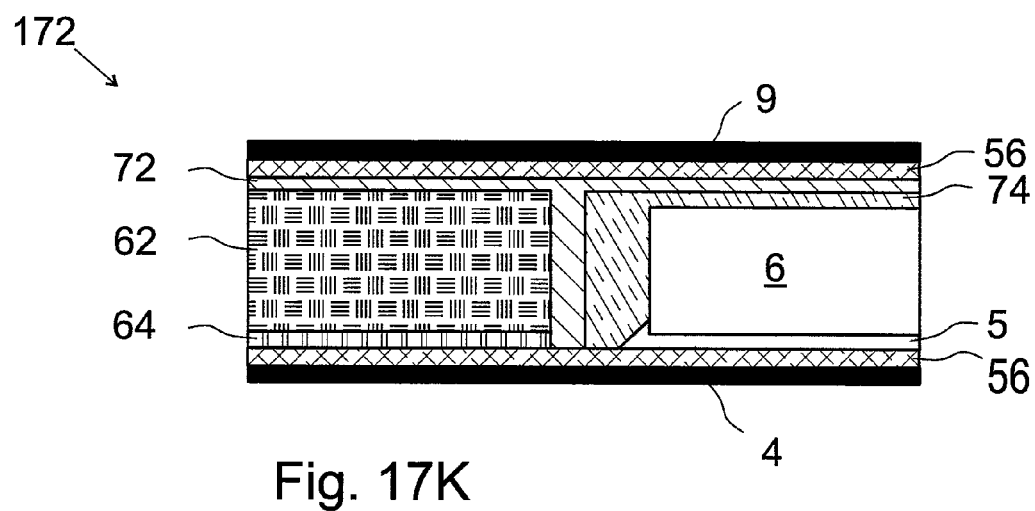

FIG. 17K shows a partial enlargement 172 of the structure of the electronic module 170 after the phase of pressing. In this example thin insulation layers 56 are used within the base layer 50 and filling layer 70. After the phase of pressing the manufacturing may continue with the phase G (FIG. 7) described above.

Figure 18A:
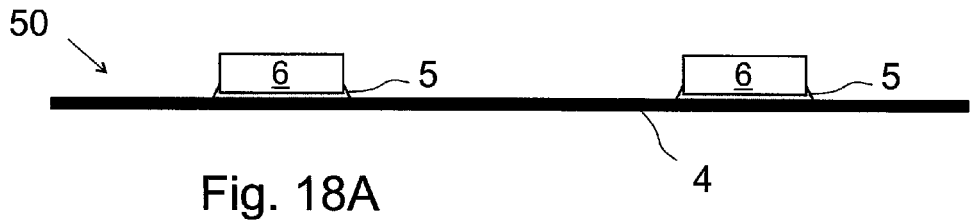

FIG. 18A shows a sixth alternative embodiment of the invention to embed a component 6 in an electronic module 180. A base layer 50 is prepared as shown with the FIGS. 1-3.

Figure 18B:
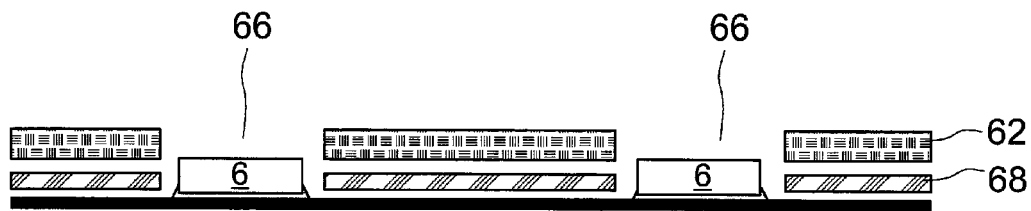

FIG. 18B shows the phase of stacking a part of insulation material layers on top of the base layer 50. The holes 66 for the component 6 to be embedded are formed e.g. mechanically or by laser to the insulation material layer 68 and a core sheet 62. The insulation material layer 68 and the core sheet 62 are lightly bonded to the base layer 50.

Figure 18C:
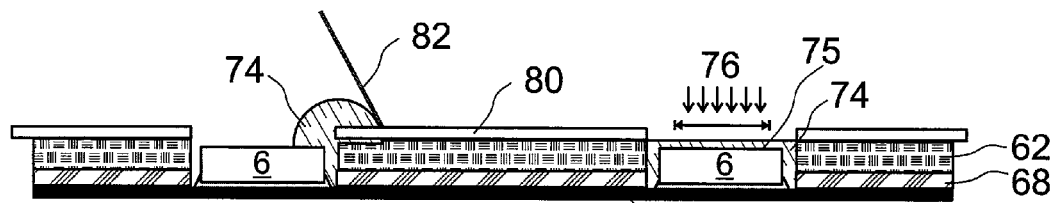

FIG. 18C shows the phase of embedding the components. A stencil 80 is put on top of the core sheet 62 and filler material 74 is printed or spread into the holes 66 with aid of spreading means 82, a squeegee, for example. After filling the filler material 74 the stencil 80 will be removed. If desired the back side 75 of the component 6 can be revealed or the filler material 74 removed 76 in a later phase partially or totally. This can be done mechanically or by etching or laser ablation, for instance. The filler material 74 can also be applied using e.g. dispensing or other spreading method. After the phase the manufacturing may continue with the phase G (FIG. 7) described above.

Figure 18D:
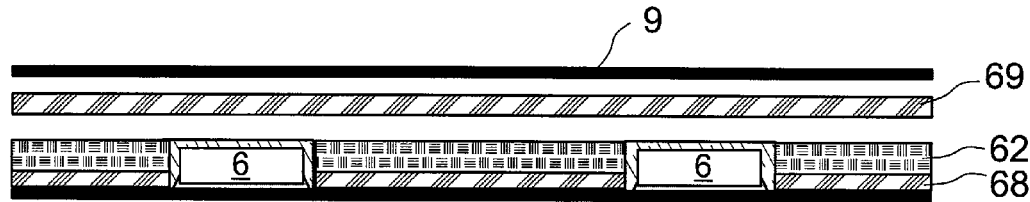

FIG. 18D shows the phase of stacking a unified separate insulation material sheet 69 on top of the core sheet 62 and filler material 74 at the location where the holes 66 were earlier. The materials of the insulation material layer 68 and unified insulation material sheet 69 can be prepreg, for example. On top of the unified insulation material sheet 69 the second conductive layer 9 will be laminated to the electronic module 180. In an alternative embodiment the unified insulation material sheet 69 and the second conductive layer 9 can be first laminated together and after that the laminated parts are stacked on top of the core sheet 62.

Figure 18E:
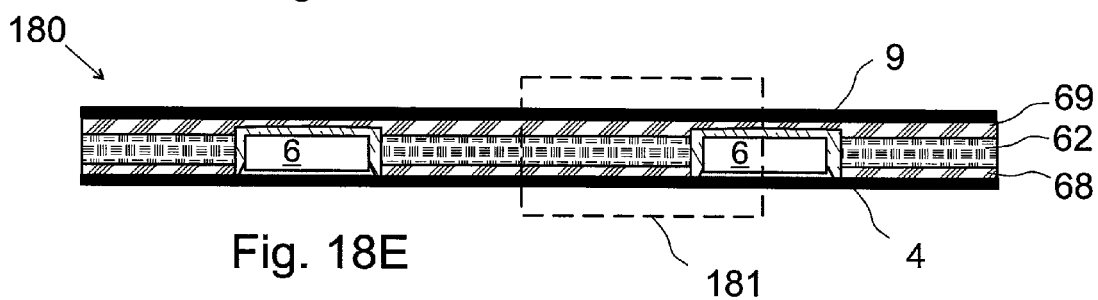

FIG. 18E shows when the stacked insulation material layer 68, core sheet 62 and unified insulation material sheet 69 are pressed together as an electronic module 180. During this phase the insulation material layer 68 and unified insulation material sheet 69 will be cured.

Figure 18F:
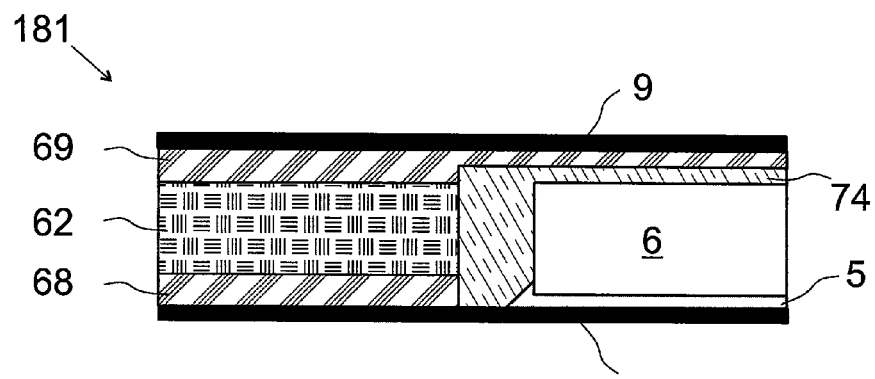

FIG. 18F shows a partial enlargement 181 of the structure of the electronic module 180 after the phase of pressing. After the phase of pressing the manufacturing may continue with the phase G (FIG. 7) described above.

Figure 19A:
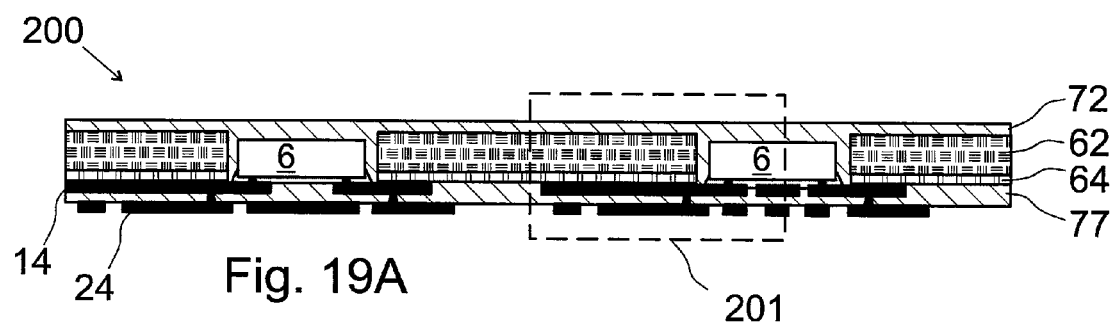

FIG. 19A shows a seventh alternative embodiment of the invention to embed a component 6 in an electronic module 200. The electronic module 200 is manufactured according to the method described in the FIGS. 1-10 and 13 when applicable. When the first conductive pattern layer 14 is made ready a build-up layer 77 and a second conductive layer are laminated over the first conductive pattern layer 14. After lamination the second conductive pattern layer 24 is patterned. This is suitable method for example making chip scale packages with fan-out and fan-in conductors. There may be one or more redistribution layers within the module.

Figure 19B:
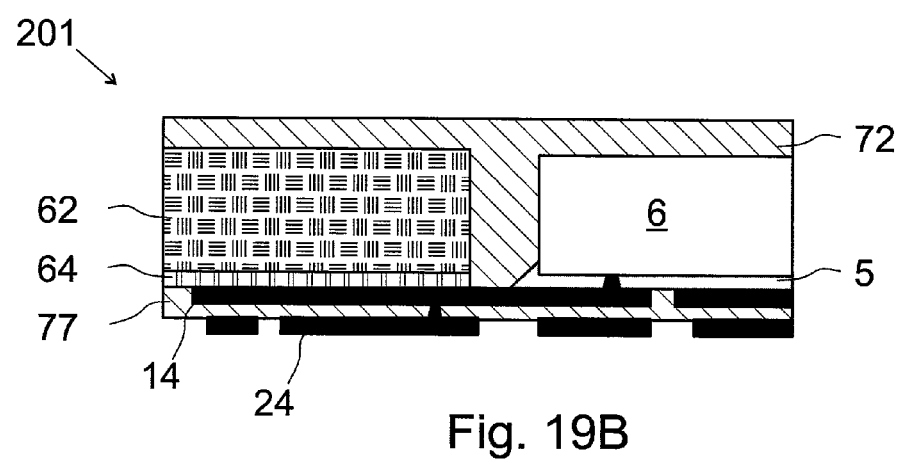

FIG. 19B shows a partial enlargement 201 of the structure of the electronic module 200 after the phase of patterning the second conductive layer 24.

Figure 19C:
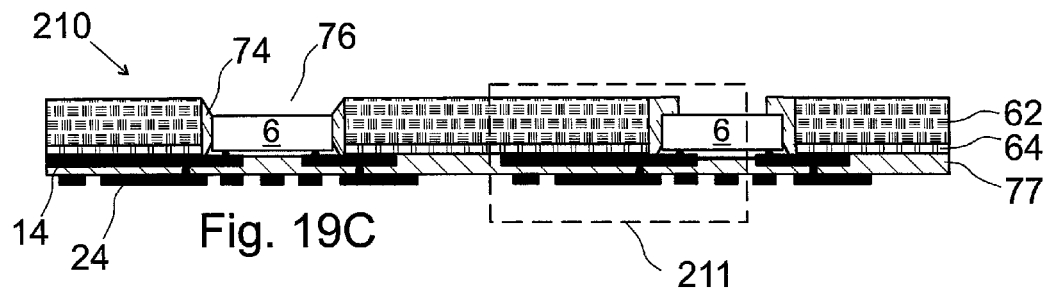

FIG. 19C shows an eighth alternative embodiment of the invention to embed a component 6 in an electronic module 210. The electronic module 210 is manufactured according to the method described in the FIGS. 1-10 and 16 when applicable. When the first conductive pattern layer 14 is made ready a build-up layer 77 and a second conductive layer are laminated over the first conductive pattern layer 14. After lamination the second conductive pattern layer 24 is patterned. This is suitable method for example making chip scale packages with fan-out and fan-in conductors. There may be one or more redistribution layers within the module. There are presented two different backside openings 76, namely the whole backside opened at left hand side and partial backside opened at right hand side. These are practical structures for MEMS, LED or like components interacting with external environment. Furthermore, the structure is suitable for heat dissipation, conducting heat away from the component.

Figure 19D:
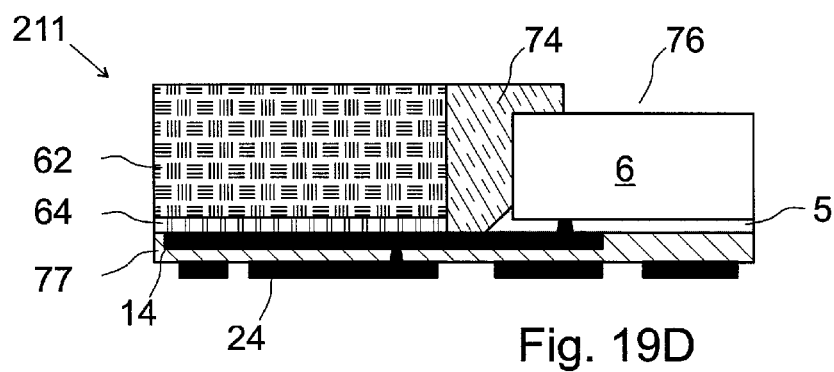

FIG. 19D shows a partial enlargement 211 of the structure of the electronic module 210 after the phase of patterning the second conductive layer 24.

Figure 19E:
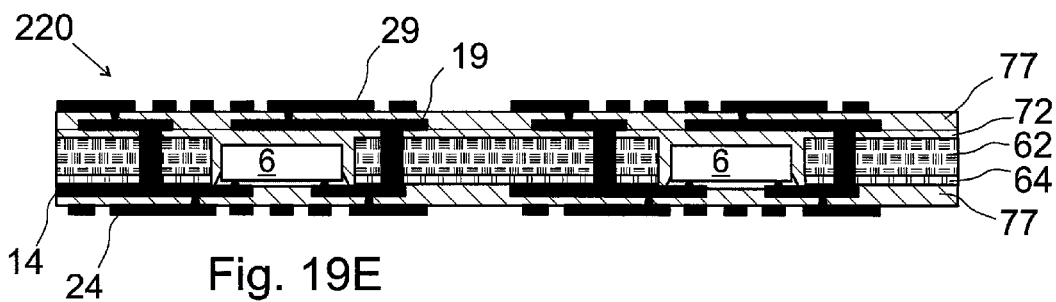

FIG. 19E shows a ninth alternative embodiment of the invention to embed a component 6 in an electronic module 220. The electronic module 220 contains two conductor pattern layers on both sides of the core layer. The first conductor pattern layers 14 and 19 are manufactured first. Then build-up layers 77 with conductor layers are laminated on both sides of the module 220. Finally the second conductive patterns layers 24 and 29 are patterned.

Figure 19F:
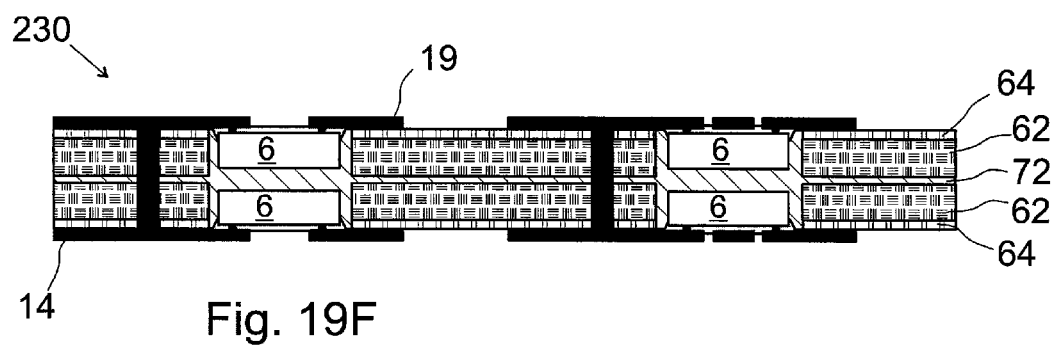

FIG. 19F shows a tenth alternative embodiment of the invention to embed a component 6 in an electronic module 230. The electronic module 230 contains two layers of embedded components 6. This can be done by manufacturing two different parts of base layer 50 and core layer 60 together. Then the parts are combined together with a filler layer 70. Alternatively the electronic module 230 can be done by stacking the embedded component layers, core layers and filler layer and laminating all the layer together at the same time.

As has been described above, an embodiment provides an electronic module comprising:

- an insulating layer having a first surface and a second surface, said insulating layer comprising at least one core sheet having at least one hole;
- a first conductive-pattern layer arranged on the first surface of the insulating layer;
- at least one bonding layer between the at least one core sheet and the first conductive-pattern layer, said at least one bonding layer forming part of the insulating layer;
- at least one component within the insulating layer, said component having contact zones arranged towards the first conductive layer and wherein at least a portion of the component is located within the at least one hole;
- a hardened adhesive layer between the component and the first conductive-pattern layer, said hardened adhesive layer forming part of the insulating layer; and
- a plurality of feedthroughs penetrating the hardened adhesive layer and forming electrical contacts between the first conductive-pattern layer and the contact zones of the component.

The at least one hole in the core sheet can suitably located such that the component can be located in the hole. Then, the core sheet can be of rigid material.

In one embodiment, the at least one core sheet is centered between the first surface and the second surface. This means that the distance from the core sheet to the first surface is generally equal to the distance from the core sheet to the second surface.

In another embodiment, the at least one component is centered between the first surface and the second surface. This means that the distance from the core sheet to the first surface is generally equal to the distance from the core sheet to the second surface.

In a further embodiment, the at least one core sheet and the at least one component are both centered between the first surface and the second surface.

There are also embodiments, wherein the at least one core sheet is placed in a non-centered position between the first surface and the second surface.

A further embodiment is such that the at least one component is placed in a non-centered position between the first surface and the second surface.

It is also possible that the at least one core sheet and the at least one component are both placed in a non-centered position between the first surface and the second surface. In such an embodiment, the non-centered position of the core sheet can be selected such as to compensate for the non-centered position of the component, or vice versa.

In an embodiment, the insulating layer further comprises filler material at least in said hole.

In an embodiment, the at least one core sheet has a first coefficient of thermal expansion, the at least one component has a second coefficient of thermal expansion lower than the first coefficient of thermal expansion and the filler material has a third coefficient of thermal expansion higher than the first coefficient of thermal expansion.

In a further embodiment, the third coefficient of thermal expansion is at least two times higher than the first coefficient of thermal expansion.

In a further embodiment, the first coefficient of thermal expansion is between 8 and 30, the second coefficient of thermal expansion is between 3 and 15, and the third coefficient of thermal expansion is between 50 and 150.

In an embodiment, the module further comprised a second conductive-pattern layer arranged on the second surface of the insulating layer and at least one bonding layer between the at least one core sheet and the second conductive-pattern layer.

In a further embodiment, there is filler material present between the component and the second conductive-pattern layer.

In a further embodiment, there is filler material present between the at least one core sheet and the second conductive-pattern layer.

According to one embodiment, the filler material present between the component and the second conductive-pattern layer and the filler material present between the at least one core sheet and the second conductive-pattern layer are same materials than the filler material, which is present in said hole in the core sheet. In another embodiment, all the filler materials are different materials. Also any other combination is possible, e.g. that two of the filler materials are of the same material and one is of a different material. Of course, also any of the filler materials can also be omitted.

In an embodiment, the insulating layer further comprises an additional insulation layer, which is present between the hardened adhesive layer and the first conductive-pattern layer as well as between the at least one core sheet and the first conductive-pattern layer.

In an embodiment, the electronic module further comprised
- a second insulating layer arranged over the first conductive-pattern layer on the first surface of the insulating layer; and
- a third conductive-pattern layer arranged on the second insulating layer.

In an embodiment, the electronic module has an operating temperature range and the insulating layer further comprises:
- a first amount of insulating material between the core sheet and the first surface, said first amount of insulating material having sufficient first properties such that it is capable of inducing a first strain due to thermal expansion and shrinkage;
- a second amount of insulating material between the core sheet and the second surface, said second amount of insulating material having sufficient second properties such that it is capable of inducing a second strain due to thermal expansion and shrinkage substantially equal to the first strain at least within the operating temperature range.

In an embodiment:
- the insulating layer has third properties within the area wherein the insulating layer comprises said at least one core sheet, said third properties being capable of inducing a third strain due to at least thermal expansion and shrinkage;
- the component has fourth properties capable of inducing a fourth strain due to at least thermal expansion;
- the insulating layer comprises a volume of filler material having fifth properties capable of inducing a fifth strain due to at least thermal expansion and shrinkage;
- wherein the third strain, fourth strain and fifth strain substantially compensate each other.

In an embodiment, the at least one core sheet is a rigid sheet of substantially cured epoxy with glass-fibre reinforcement. In this embodiment, it is good to have said at least one hole made in the glass-fibre reinforcement so that the glass-fibre reinforcement will not be laminated against the surface of the component.

In an embodiment, the at least one bonding layer has at least one hole such that said at least one bonding layer is not present between the component and the first conductive-pattern layer.

In an embodiment:
the at least one component is capable of inducing a fourth strain due to at least thermal expansion;
the insulating layer comprises materials and interfaces between the materials as well as an interface with the at least one component, said materials and interfaces capable of inducing a sixth strain due to at least thermal expansions and shrinkages of the materials; and
the at least one component is placed in one of a centered position or a non-centered position between the first surface and the second surface such that the fourth strain is capable of at least partially compensating the effect of the sixth strain.

According to another embodiment, there is provided an electronic module comprising:
an insulating layer having a first surface and a second surface, said insulating layer comprising at least one core sheet, said at least one core sheet containing at least one glass-fibre mat and having at least one hole in said at least one glass-fibre mat;
at least one component within the insulating layer, said component having contact zones arranged towards the first surface and wherein at least a portion of the component is located within said at least one hole;
a first conductive-pattern layer arranged on the first surface of the insulating layer;
attachment areas between each of said at least one component and said first conductive-pattern layer;
a hardened adhesive layer substantially within the attachment areas, said hardened adhesive layer forming part of the insulating layer; and
a plurality of feedthroughs penetrating the hardened adhesive layer and forming electrical contacts between the first conductive-pattern layer and at least a plurality of the contact zones of said at least one component.

In an embodiment, such an electronic module is such that:
the first surface has a first surface area;
the hardened adhesive layer has a second surface area substantially parallel with the first surface, said second surface area being smaller than the first surface area; and
the at least one component has a third surface area substantially parallel with the first surface said third surface area being smaller than the second surface area.

In an embodiment, the electronic module comprised at least one bonding layer between the at least one core sheet and the first conductive-pattern layer outside the attachment areas, said at least one bonding layer forming part of the insulating layer.

In an embodiment, the at least one bonding layer has a fourth surface area substantially parallel with the first surface such that the sum of said fourth surface area and said second surface area is substantially equal to said first surface area.

According to a further embodiment, there is provided an electronic module comprising:
an insulating layer having a first surface and a second surface, said insulating layer comprising at least one core sheet, said at least one core sheet containing at least one glass-fibre mat and having at least one hole in said at least one glass-fibre mat;
at least one component within the insulating layer, said component having contact zones arranged towards the first surface and wherein at least a portion of the component is located within said at least one hole;
a first conductive-pattern layer arranged on the first surface of the insulating layer;
attachment areas between each of said at least one component and said first conductive-pattern layer;
at least one bonding layer between the at least one core sheet and the first conductive-pattern layer outside the attachment areas, said at least one bonding layer forming part of the insulating layer;
a hardened adhesive layer substantially within the attachment areas, said hardened adhesive layer forming part of the insulating layer; and
a plurality of feedthroughs penetrating the hardened adhesive layer and forming electrical contacts between the first conductive-pattern layer and at least a plurality of the contact zones of said at least one component;
wherein the at least one core sheet has a first coefficient of thermal expansion, the component has a second coefficient of thermal expansion lower than the first coefficient of thermal expansion and the filler material has a third coefficient of thermal expansion higher than the first coefficient of thermal expansion.

The examples and embodiments presented above and in the Figures show some possible processes, with the aid of which our invention can be exploited. Our invention is not, however, restricted to only the processes disclosed above, but instead the invention also encompasses various other processes and their end products, taking into account the full scope of the Claims and the interpretation of their equivalences. The invention is also not restricted to only the constructions and method described by the examples, it being instead obvious to one versed in the art that various applications of our invention can be used to manufacture a wide range of different electronic modules and circuit boards, which differ greatly from the examples described above. Thus, the components and wiring of the figures are shown only with the intention of illustrating the manufacturing process. Thus many alterations to and deviations from the processes of the examples shown above can be made, while nevertheless remaining within the basic idea according to the invention. The alterations can relate, for example, to the manufacturing techniques described in the different stages, or to the mutual sequence of the process stages.

With the aid of the method, it is also possible to manufacture component packages for connection to a circuit board. Such packages can also include several components that are connected electrically to each other.

The method can also be used to manufacture total electrical modules. The module can also be a circuit board, to the outer surface of which components can be attached, in the same way as to a conventional circuit board.

The invention claimed is:
1. An electronic module, the module comprising:
an insulating layer having a first surface and a second surface, said insulating layer comprising at least one core sheet having at least one hole;
a first conductive-pattern layer arranged on the first surface of the insulating layer;
at least one bonding layer between the at least one core sheet and the first conductive-pattern layer, said at least one bonding layer forming part of the insulating layer;
at least one component within the insulating layer, said component having contact zones arranged towards the first conductive layer and wherein at least a portion of the component is located within the at least one hole;
a hardened adhesive layer between the component and the first conductive-pattern layer, said hardened adhesive layer forming part of the insulating layer; and a plurality of feedthroughs penetrating the hardened adhesive layer and forming electrical contacts between the first conductive-pattern layer and the contact zones of the component.

2. The electronic module of claim 1, wherein at least one of the at least one core sheet or the at least one component is centered between the first surface and the second surface.

3. The electronic module of claim 1, wherein at least one of the at least one core sheet or the at least one component is placed in a non-centered position between the first surface and the second surface.

4. The electronic module according to claim 1, wherein the insulating layer further comprises filler material at least in said hole.

5. The electronic module according to of claim 4, wherein the at least one core sheet has a first coefficient of thermal expansion, the at least one component has a second coefficient of thermal expansion lower than the first coefficient of thermal expansion and the filler material has a third coefficient of thermal expansion higher than the first coefficient of thermal expansion.

6. The electronic module of claim 5, wherein the third coefficient of thermal expansion is at least two times higher than the first coefficient of thermal expansion.

7. The electronic module of claim 5, wherein the first coefficient of thermal expansion is between 8 and 30, the second coefficient of thermal expansion is between 3 and 15, and the third coefficient of thermal expansion is between 50 and 150.

8. The electronic module according to claim 1, further comprising a second conductive-pattern layer arranged on the second surface of the insulating layer and at least one bonding layer between the at least one core sheet and the second conductive-pattern layer.

9. The electronic module of claim 8, wherein filler material is present between the component and the second conductive-pattern layer.

10. The electronic module of claim 9, wherein filler material is present between the at least one core sheet and the second conductive-pattern layer.

11. The electronic module according to claim 1, wherein the insulating layer further comprises an additional insulation layer, which is present between the hardened adhesive layer and the first conductive-pattern layer as well as between the at least one core sheet and the first conductive-pattern layer.

12. The electronic module according to claim 1, further comprising
a second insulating layer arranged over the first conductive-pattern layer on the first surface of the insulating layer; and
a third conductive-pattern layer arranged on the second insulating layer.

13. The electronic module according to claim 1, wherein the electronic module has an operating temperature range and wherein the insulating layer further comprises:
a first amount of insulating material between the core sheet and the first surface, said first amount of insulating material having sufficient first properties such that it is capable of inducing a first strain due to thermal expansion and shrinkage;
a second amount of insulating material between the core sheet and the second surface, said second amount of insulating material having sufficient second properties such that it is capable of inducing a second strain due to thermal expansion and shrinkage substantially equal to the first strain at least within the operating temperature range.

14. The electronic module according to claim 1, wherein:
the insulating layer has third properties within the area wherein the insulating layer comprises said at least one core sheet, said third properties being capable of inducing a third strain due to at least thermal expansion and shrinkage;
the component has fourth properties capable of inducing a fourth strain due to at least thermal expansion;
the insulating layer comprises a volume of filler material having fifth properties capable of inducing a fifth strain due to at least thermal expansion and shrinkage;
wherein the third strain, fourth strain and fifth strain substantially compensate each other.

15. The electronic module according to claim 1, wherein the at least one core sheet is a rigid sheet of substantially cured epoxy with glass-fibre reinforcement.

16. The electronic module according to claim 1, wherein the at least one bonding layer has at least one hole such that said at least one bonding layer is not present between the component and the first conductive-pattern layer.

17. The electronic module according to claim 1, wherein
the at least one component is capable of inducing a fourth strain due to at least thermal expansion;
the insulating layer comprises materials and interfaces between the materials as well as an interface with the at least one component, said materials and interfaces capable of inducing a sixth strain due to at least thermal expansions and shrinkages of the materials; and
the at least one component is placed in one of a centered position or a non-centered position between the first surface and the second surface such that the fourth strain is capable of at least partially compensating the effect of the sixth strain.

18. An electronic module, the module comprising:
an insulating layer having a first surface and a second surface, said insulating layer comprising at least one core sheet, said at least one core sheet containing at least one glass-fibre mat and having at least one hole in said at least one glass-fibre mat;
at least one component within the insulating layer, said component having contact zones arranged towards the first surface and wherein at least a portion of the component is located within said at least one hole;
a first conductive-pattern layer arranged on the first surface of the insulating layer;
attachment areas between each of said at least one component and said first conductive-pattern layer;
a hardened adhesive layer substantially within the attachment areas, said hardened adhesive layer forming part of the insulating layer; and
a plurality of feedthroughs penetrating the hardened adhesive layer and forming electrical contacts between the first conductive-pattern layer and at least a plurality of the contact zones of said at least one component.

19. The electronic module of claim 18, wherein
the first surface has a first surface area;
the hardened adhesive layer has a second surface area substantially parallel with the first surface, said second surface area being smaller than the first surface area; and
the at least one component has a third surface area substantially parallel with the first surface said third surface area being smaller than the second surface area.

20. The electronic module of claim 18, comprising at least one bonding layer between the at least one core sheet and the first conductive-pattern layer outside the attachment areas, said at least one bonding layer forming part of the insulating layer.

21. The electronic module of claim 20, wherein the at least one bonding layer has a fourth surface area substantially parallel with the first surface such that the sum of said fourth surface area and said second surface area is substantially equal to said first surface area.

22. An electronic module, the module comprising:
- an insulating layer having a first surface and a second surface, said insulating layer comprising at least one core sheet, said at least one core sheet containing at least one glass-fibre mat and having at least one hole in said at least one glass-fibre mat;
- at least one component within the insulating layer, said component having contact zones arranged towards the first surface and wherein at least a portion of the component is located within said at least one hole;
- a first conductive-pattern layer arranged on the first surface of the insulating layer;
- attachment areas between each of said at least one component and said first conductive-pattern layer;
- at least one bonding layer between the at least one core sheet and the first conductive-pattern layer outside the attachment areas, said at least one bonding layer forming part of the insulating layer;
- a hardened adhesive layer substantially within the attachment areas, said hardened adhesive layer forming part of the insulating layer; and
- a plurality of feedthroughs penetrating the hardened adhesive layer and forming electrical contacts between the first conductive-pattern layer and at least a plurality of the contact zones of said at least one component;
- wherein the at least one core sheet has a first coefficient of thermal expansion, the component has a second coefficient of thermal expansion lower than the first coefficient of thermal expansion and the filler material has a third coefficient of thermal expansion higher than the first coefficient of thermal expansion.

* * * * *